(12) United States Patent
Sandhu et al.

(10) Patent No.: US 8,592,795 B2
(45) Date of Patent: Nov. 26, 2013

(54) MULTILEVEL MIXED VALENCE OXIDE (MVO) MEMORY

(75) Inventors: Gurtej S. Sandhu, Boise, ID (US); Eugene P. Marsh, Boise, ID (US)

(73) Assignee: Micron Technology, Inc., Boise, ID (US)

(*) Notice: Subject to any disclaimer, the term of this patent is extended or adjusted under 35 U.S.C. 154(b) by 212 days.

(21) Appl. No.: 13/175,320

(22) Filed: Jul. 1, 2011

(65) Prior Publication Data

US 2013/0001495 A1 Jan. 3, 2013

(51) Int. Cl.
*H01L 45/00* (2006.01)
*H01L 21/20* (2006.01)

(52) U.S. Cl.
USPC .......... 257/4; 257/E45.002; 257/E21.09; 438/382

(58) Field of Classification Search
None
See application file for complete search history.

(56) References Cited

U.S. PATENT DOCUMENTS

| | | | |
|---|---|---|---|
| 5,687,112 A | 11/1997 | Ovshinsky | |
| 6,791,102 B2 | 9/2004 | Johnson et al. | |
| 7,524,722 B2 | 4/2009 | Lee et al. | |
| 7,697,316 B2 | 4/2010 | Lai et al. | |
| 8,233,311 B2* | 7/2012 | Shimakawa et al. | 365/148 |
| 8,330,139 B2 | 12/2012 | Ramaswamy et al. | |
| 2006/0002174 A1* | 1/2006 | Hosoi et al. | 365/148 |
| 2006/0003489 A1* | 1/2006 | Zhang et al. | 438/102 |
| 2007/0165442 A1* | 7/2007 | Hosoi et al. | 365/100 |
| 2007/0269683 A1* | 11/2007 | Chen et al. | 428/697 |
| 2008/0025072 A1* | 1/2008 | Tamai et al. | 365/148 |
| 2009/0078983 A1 | 3/2009 | Nakasaki et al. | |
| 2009/0134432 A1 | 5/2009 | Tabata et al. | |
| 2009/0289251 A1 | 11/2009 | Kiyotoshi | |
| 2010/0155723 A1* | 6/2010 | Bornstein et al. | 257/43 |
| 2010/0167463 A1* | 7/2010 | Sung | 438/104 |
| 2010/0188884 A1* | 7/2010 | Mitani et al. | 365/148 |
| 2010/0207094 A1* | 8/2010 | Kanzawa et al. | 257/4 |
| 2010/0208508 A1 | 8/2010 | Baek | |
| 2011/0068316 A1 | 3/2011 | Takano et al. | |
| 2011/0161605 A1* | 6/2011 | Lee et al. | 711/154 |
| 2012/0086104 A1* | 4/2012 | Marsh | 257/532 |
| 2012/0241711 A1 | 9/2012 | Ramaswamy et al. | |
| 2013/0010526 A1 | 1/2013 | Ramaswamy et al. | |

FOREIGN PATENT DOCUMENTS

| | | |
|---|---|---|
| TW | 201306219 A | 2/2013 |
| WO | WO-2011020122 A1 | 2/2011 |
| WO | WO-2013006376 A2 | 1/2013 |
| WO | WO-2013006376 A3 | 1/2013 |

OTHER PUBLICATIONS

Cleveland L. Metal Oxide Hetero Junction Operation Nonvolatile Memory, FlashMemory Summit, Cleveland 2012.*

(Continued)

*Primary Examiner* — Thomas L Dickey
*Assistant Examiner* — Joseph Schoenholtz
(74) *Attorney, Agent, or Firm* — Schwegman, Lundberg & Woessner, P.A.

(57) ABSTRACT

Various embodiments include a memory device and methods of forming the same. The memory device can include an electrode coupled to one or more memory elements, to store information. The electrode may comprise a number of metals, where a first one of the metals has a Gibbs free energy for oxide formation lower than the Gibbs free energy of oxidation of a second one of the metals.

26 Claims, 11 Drawing Sheets

(56) References Cited

OTHER PUBLICATIONS

Liao, Z. L., Z. Z. Wang, Y. Meng, Z. Y. Liu, P. Gao, J. L. Gang, H. W. Zhao, X. J. Liang, X. D. Bai, and D. M. Chen. "Categorization of Resistive Switching of Metal-Pr0.7Ca0.3MnO3-metal Devices." Applied Physics Letters 94.25 (2009): 253503.*

Oxidation-Reduction (Redox) Reactions and Potentials downloaded from URL<http://scholar.lib.vt.edu/theses/available/etd-01102003-162857/unrestricted/(08)Lit_Rev_2.pdf> on Dec. 27, 2012.*

Periodical Tabel of Elements Ti, downloaded from URL<http://www.periodni.com/ti.html> on Dec. 27, 2012.*

Periodical Tabel of Elements Pt, downloaded from URL<http://www.periodni.com/ti.html> on Dec. 27, 2012.*

Kim, D. S., C. E. Lee, Y. H. Kim, and Y. T. Kim. "Effect of Oxygen Annealing on Pr[sub 0.7]Ca[sub 0.3]MnO[sub 3] Thin Film for Colossal Electroresistance at Room Temperature." Journal of Applied Physics 100.9 (2006): 093901.*

Ellingham Diagram downloaded from URL <http://web.deu.edu.tr/metalurjimalzeme/pdf/MMM2003MetalurjiTermodinamigi/EllinghamKaynak2.pdf> on Dec. 27, 2012.*

Jian-Lei, Gang, Li Song-Lin, Liao Zhao-Liang, Meng Yang, Liang Xue-Jin, and Chen Dong-Min. "Clockwise vs Counter-Clockwise-Hysteresis of Point-Contact Metal-Tip/PrCaMnO/Pt Devices." Chinese Physics Letters 27.2 (2010).*

Asanuma, S., and H. Akoh. "Relationship between Resistive Switching Characteristics and Band Diagrams of Ti/Pr1—xCaxMnO3 Junctions." Physical Review B 80.23 (2009).*

Tedulkar, Mihir, Impact of Hydrogen on the Forming and Switching Behaviors of PCMO Thin Films for Resistance Change Random Access Memory. Diss. Stanford, 2011. Stanford: Stanford University, May 2011.*

Burr, Geoffrey, et. al.. "Phase Change Memory Technology." Journal of Vacuum Science & Technology B: Microelectronics and Nanometer Structures 28.2 (2010) 223.*

Kaji H., et. al. Effect of electrode and interface oxide on the property of ReRAM composed of Pr0.7Ca0.3MnO3 IOP Conf. Series: Materials Science and Engineering 8 (2010) 012032.*

Kawano, Hiroyasu, Keiji Shono, Takeshi Yokota, and Manabu Gomi. "Enhancement of Switching Capability on Bipolar Resistance Switching Device with Ta/PrCaMnO/Pt Structure." Applied Physics Express 1 (2008): 101901.*

Shono, Keiji, Hiroyasu Kawano, Takeshi Yokota, and Manabu Gomi. "Origin of Negative Differential Resistance Observed on Bipolar Resistance Switching Device with Ti/PrCaMnO/Pt Structure." Applied Physics Express 1 (2008): 055002.*

H.-S. P. Wong, et. al., "Phase Change Memory" Proc. IEEE 98, 2201 (2010).*

R. Yasuhara, T. Yamamoto, I. Ohkubo, H. Kumigashira, and M. Oshima, Appl. Phys. Lett. 97, 132111 (2010).*

Hwang, Hyunsang "Electrical and Reliability Characteristics of RRAM for Cross-point Memory Applications" 7th International Symposium on Advanced Gate Stack Technology Sematech Sep. 29, 2010 Albany NY.*

W. Lee, G. Jo, S. Lee, J. Park, M. Jo, J. Lee, S. Jung, S. Kim, J. Shin, S. Park, T. Lee, and H. Hwang, Appl. Phys. Lett. 98, 032105 (2011).*

International Application Serial No. PCT/US2012/044653, International Search Report mailed Jan. 25, 2013, 3 pgs.

International Application Serial No. PCT/US2012/044653, Written Opinion mailed Jan. 25, 2013, 6 pgs.

* cited by examiner

US 8,592,795 B2

MULTILEVEL MIXED VALENCE OXIDE (MVO) MEMORY

BACKGROUND

Computers and other electronic products, for example, digital televisions, digital cameras, and cellular phones, often have one or more memory devices to store information. Some memory devices may have memory cells that are capable of storing multiple bits of information in each memory cell. In some cases, however, producing these types of memory devices may pose challenges.

DETAILED DESCRIPTION

Figure 1:
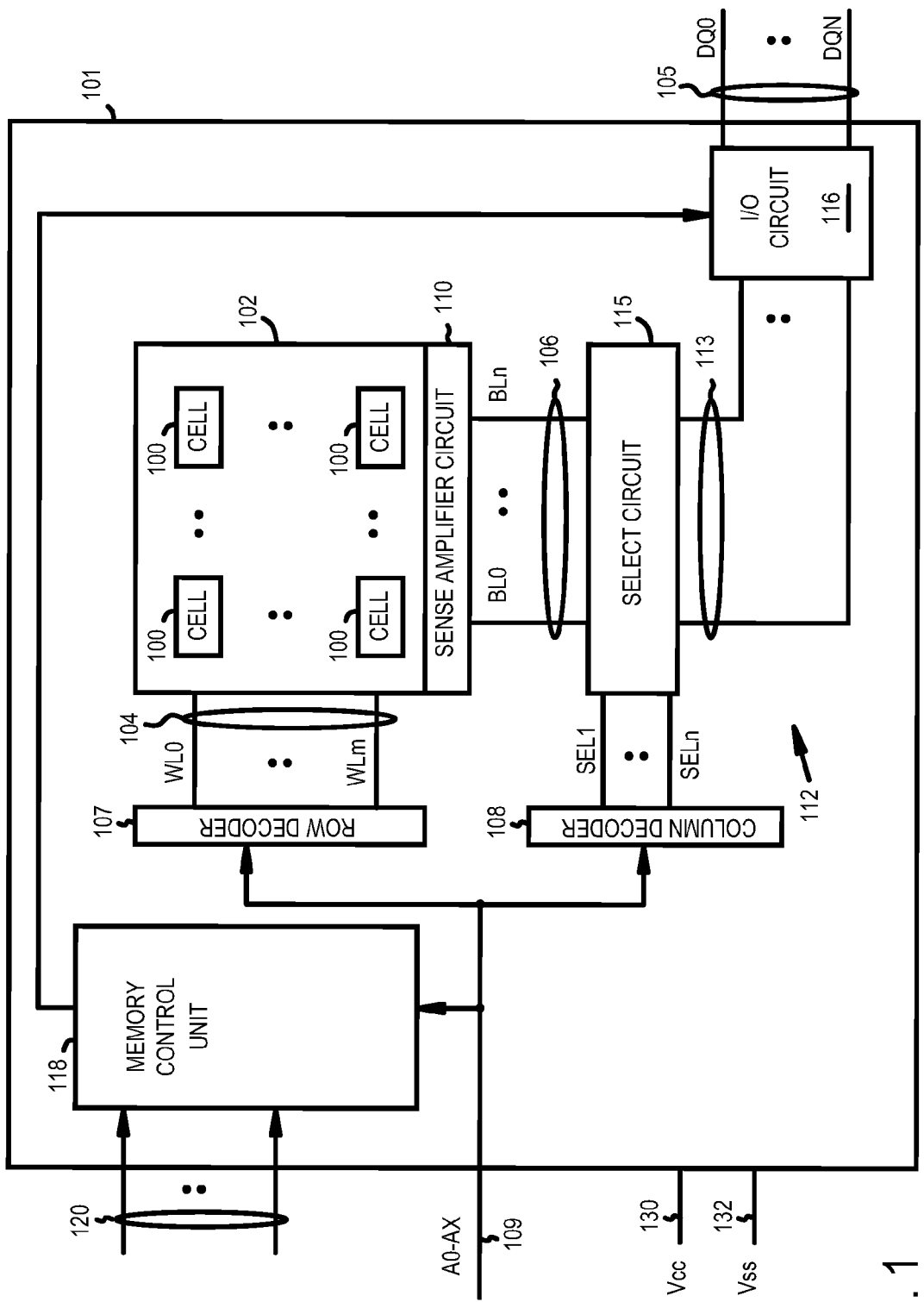
FIG. 1 shows a block diagram of a memory device having a memory array with memory cells, according to an embodiment.

The description that follows includes illustrative systems, methods, techniques, and programming sequences that embody the inventive subject matter. In the following description, for purposes of explanation, numerous specific details are set forth in order to provide an understanding of various embodiments of the inventive subject matter. It will be evident, however, to those skilled in the art that various embodiments of the inventive subject matter may be practiced without these specific details. Further, well-known instruction instances, protocols, structures, methods, fabrication technologies, and techniques have not been shown in detail.

As used herein, the term "or" may be construed in an inclusive or exclusive sense. Additionally, although various exemplary embodiments discussed below focus on a multilevel mixed valence oxide (MVO) memory, the embodiments are merely given for clarity in disclosure, and thus, are not limited to multilevel MVO memory. As an introduction to the subject, a few embodiments will be described briefly and generally in the following paragraphs, and then a more detailed description, with reference to the figures, will ensue.

In various embodiments, a memory device is provided that includes at least one memory element to store information, with an electrode coupled to the at least one memory element. The electrode can include a number of metals, where a first one of the metals has a Gibbs free energy for the formation of oxide lower than the Gibbs free energy of oxidation of a second one of the metals.

In embodiments of the memory device, each of the plurality of metals is layered and substantially parallel to a surface of the at least one memory element coupled to the plurality of metals. In embodiments, the plurality of metals is dispersed substantially randomly over a surface of the at least one memory element coupled to the plurality of metals. In embodiments, the at least one memory element is configured to store multiple bits of information. In embodiments, the memory device further includes a second electrode coupled to the at least one memory element such that the at least one memory element is disposed between the second electrode and the first electrode. In embodiments, the at least one memory element includes at least one of $Pr_xCa_yMn_zO$, $La_xCa_yMnO_z$, $La_xSr_yCo_xY$, $TiO_x$, $HfO_x$, or $ZrO_x$. In embodiments, the at least one memory element includes a mixed valence oxide.

In various embodiments, a memory device is provided that includes a number of metals. The number of metals includes a first metal having a Gibbs free energy of oxidation lower than the Gibbs free energy of oxidation of a second metal. A memory element in the device is electrically coupled to the metals such that the memory element provides oxygen atoms to the metals when a bias voltage is applied across the memory element and the metals. The memory element is at least partially comprised of a mixed valence oxide.

In embodiments of the memory device, the Gibbs free energy of the first metal of the plurality of metals is more negative than a Gibbs free energy of the memory element. In embodiments, the memory device further includes a first electrode and a second electrode, with the plurality of metals and the memory element being disposed between the first electrode and the second electrode. In embodiments, the memory element is configured to store bits of information. In embodiments, the memory element includes oxygen.

In various embodiments, a memory device is provided that includes a first electrode for coupling to a first voltage supply terminal, at least one memory element coupled to the first electrode comprising a mixed valence oxide, and a second electrode for coupling to a second voltage supply terminal. The second electrode includes a number of metals electrically coupled to the at least one memory element. The metals include at least one metal oxide to store information in the at least one memory element in response to an electrical bias generated by a voltage supply coupled to the first and second electrodes.

In embodiments of the memory device, a first metal of the plurality of metals has a Gibbs free energy of oxidation lower than a Gibbs free energy of oxidation of a second metal of the plurality of metals. In embodiments, the at least one memory element includes a material having oxygen.

In various embodiments, a method of forming a memory device is described, including forming a memory material on a substrate and forming a first metal over the memory material. The first metal has a Gibbs free energy of oxidation more negative than a Gibbs free energy of the memory material. A second metal is formed over the memory material with the second metal having a Gibbs free energy more negative than the Gibbs free energy of the first metal. The memory device is annealed to at least partially oxidize the first metal but not necessarily the second metal.

In embodiments of the method of forming a memory device, the method includes supplying oxygen atoms to oxidize the first metal and the second metal from the memory material. In embodiments, the method includes supplying gaseous oxygen to the memory device during the annealing to supply oxygen atoms to oxidize the first metal and the second metal. In embodiments, the method includes forming the first metal and the second metal in alternate layers. In embodiments, the method includes forming the first metal and the second metal concurrently.

In various embodiments, a method of forming a memory device is described, including forming a mixed valence oxide on a substrate, forming a first metal over the mixed valence oxide, forming a second metal over the mixed valence oxide, and at least partially oxidizing the first metal with oxygen atoms from the mixed valence oxide.

In embodiments of the method of forming a memory device, the forming of the first metal and the second metal over the mixed valence oxide includes forming the first metal having a Gibbs free energy of oxidation more negative than a Gibbs free energy of the mixed valence oxide, and forming the second metal having a Gibbs free energy of oxidation more negative than the Gibbs free energy of oxidation of the first metal. In embodiments, the method includes forming the first metal and the second metal consecutively. In embodiments, the method includes forming the first metal and the second metal concurrently. In embodiments, the first metal and the second metal include different metal materials.

Referring now to FIG. 1, a block diagram of a memory device 101 is shown. The memory device 101 is shown to include a memory array 102 having a plurality of memory cells 100 according to an embodiment. The memory cells 100 can be arranged in rows and columns along with access lines 104 (e.g., wordlines to conduct signals WL0 through WLm) and first data lines 106 (e.g., bit lines to conduct signals BL0 through BLn). The memory device 101 can use the access lines 104 and the first data lines 106 to transfer information to and from the memory cells 100. A row decoder 107 and a column decoder 108 decode address signals A0 through AX on address lines 109 to determine which ones of the memory cells 100 are to be accessed.

A sense amplifier circuit 110 operates to determine a value of information read from the memory cells 100 and the information in the form of signals to the first data lines 106. The sense amplifier circuit 110 can also use the signals on the first data lines 106 to determine values of information to be written to the memory cells 100.

The memory device 101 is further shown to include circuitry 112 to transfer information between the memory array 102 and input/output (I/O) lines 105. Signals DQ0 through DQN on the I/O lines 105 can represent information read from or written into the memory cells 100. The I/O lines 105 can include nodes within the memory device 101 (or alternatively, pins, solder balls, or other interconnect technologies such as controlled collapse chip connection (C4), or flip chip attach (FCA)) on a package where the memory device 101 can reside. Other devices external to the memory device 101 (e.g., a memory controller or a processor, not shown in FIG. 1) can communicate with the memory device 101 through the I/O lines 105, the address lines 109, or control lines 120.

The memory device 101 can perform memory operations, such as a read operation, to read information from selected ones of the memory cells 100 and a programming operation (also referred to as a write operation) to program (e.g., to write) information into selected ones of the memory cells 100. The memory device 101 can also perform a memory erase operation to clear information from some or all of the memory cells 100. A memory control unit 118 controls memory operations based on signals on the control lines 120. Examples of the signals on the control lines 120 can include one or more clock signals and other signals to indicate which operation (e.g., a programming or read operation) the memory device 101 can or should perform. Other devices external to the memory device 101 (e.g., a processor or a memory controller) can control the values of the control signals on the control lines 120. Specific values of a combination of the signals on the control lines 120 can produce a command (e.g., a programming or read command) that can cause the memory device 101 to perform a corresponding memory operation (e.g., a program, read, or erase operation).

Each of the memory cells 100 can be programmed to store information representing a value of a single bit or a value of multiple bits such as two, three, four, or a higher number of bits. For example, each of the memory cells 100 can be programmed to store information representing a binary value "0" or "1" of a single bit. The single bit per cell is sometimes called a single level cell. In another example, each of the memory cells 100 can be programmed to store information representing a value representing multiple bits, such as one of four possible values "00," "01," "10," and "11" of two bits, one of eight possible values "000," "001," "010," "011," "100," "101," "110," and "111" of three bits, or one of another set of values of multiple bits. A cell that has an ability to store multiple bits is sometimes referred to as a multi-level cell (or multi-state cell). Various operations on these types of cells are discussed in more detail, below.

The memory device 101 can receive a supply voltage, including supply voltage signals Vcc and Vss, on a first supply line 130 and a second supply line 132, respectively. Supply voltage signal Vss can operate at a ground potential (e.g., having a value of approximately zero volts). Supply voltage signal Vcc can include an external voltage supplied to the memory device 101 from an external power source such as a battery or an alternating-current to direct-current (AC-DC) converter circuitry (not shown in FIG. 1).

The circuitry 112 of the memory device 101 is further shown to include a select circuit 115 and an input/output (I/O) circuit 116. The select circuit 115 can respond to signals SEL1 through SELn to select signals on the first data lines 106 and the second data lines 113 that can represent the information read from or programmed into the memory cells 100. The column decoder 108 can selectively activate the SEL1 through SELn signals based on the A0 through AX address signals on the address lines 109. The select circuit 115 can select the signals on the first data lines 106 and the second data lines 113 to provide communication between the memory array 102 and the I/O circuit 116 during read and programming operations.

The memory device 101 can include a non-volatile memory device and the memory cells 100 can include non-volatile memory cells such that the memory cells 100 can retain information stored therein when power (e.g., Vcc, Vss, or both) is disconnected from the memory device 101.

Each of the memory cells 100 can include a memory element having material, at least a portion of which can be programmed to change the resistance value of the material. Each of the memory cells 100 can have a state corresponding to a resistance value when each of the memory cells 100 is programmed in a programming operation. Different resistance values can thus represent different values of information programmed in each of the memory cells 100. This type of memory element and its related resistance values are discussed in more detail, below.

The memory device 101 can perform a programming operation when it receives (e.g., from an external processor or a memory controller) a programming command and a value of information to be programmed into one or more selected ones of the memory cells 100. Based on the value of the information, the memory device 101 can program the selected memory cells to cause them to have appropriate resistance values to represent the values of the information stored therein.

One of ordinary skill in the art may recognize that the memory device 101 may include other components, at least some of which are discussed herein. However, several of these components are not necessarily shown in the figure, so as not to obscure the various embodiments described. The memory device 101 may include devices and memory cells, and operate using memory operations (e.g., programming and erase operations) similar to or identical to those described below with reference to various other figures and embodiments discussed herein.

Figure 2:
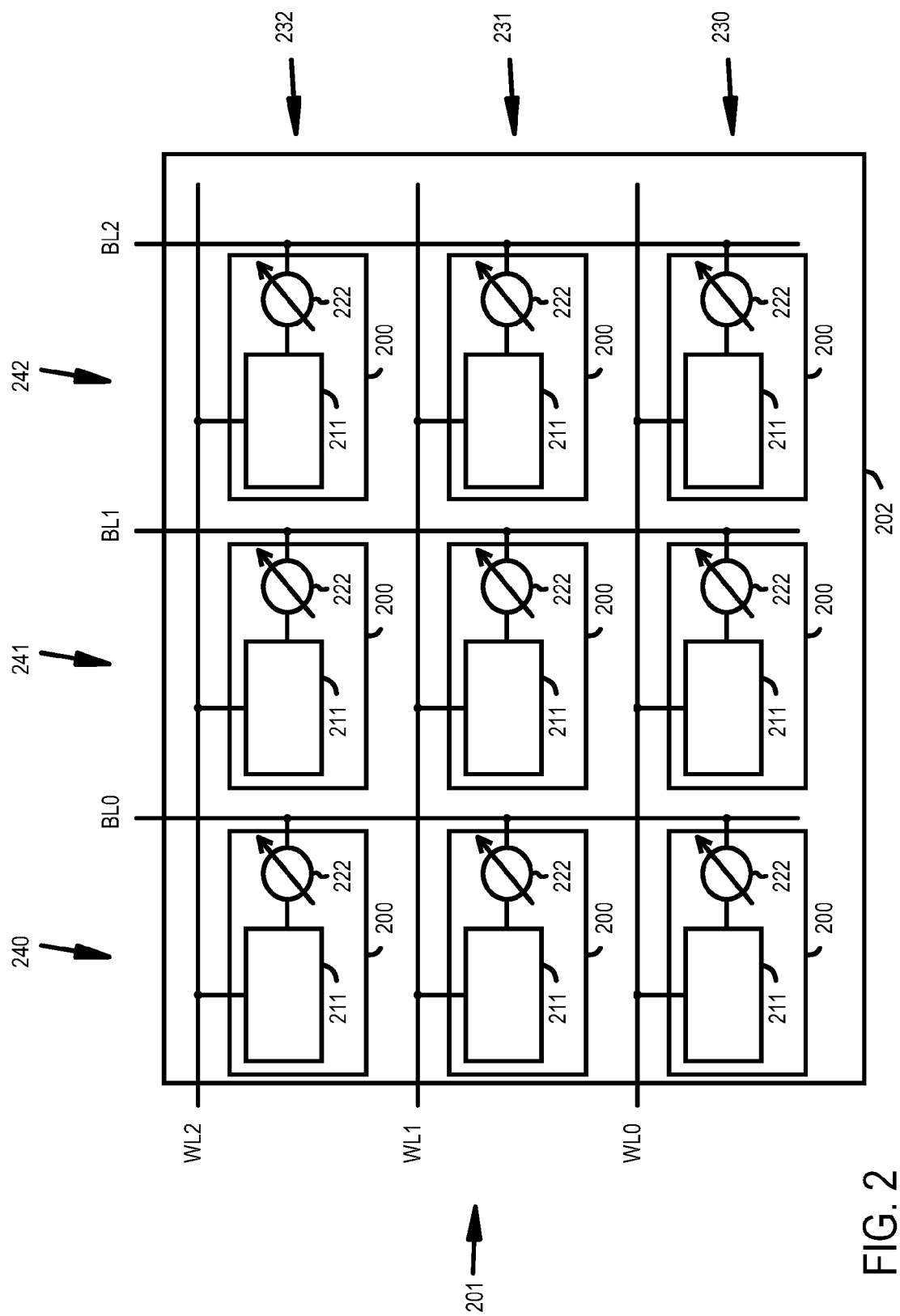
FIG. 2 shows a partial block diagram of a memory device having a memory array including memory cells with access components and memory elements, according to an embodiment.

With reference now to FIG. 2, a partial block diagram of a memory device 201 is shown to include a memory array 202 including memory cells 200 with access components 211 and memory elements 222, according to an example embodiment. The memory array 202 may be similar or identical to the memory array 102 of FIG. 1. As further shown in FIG. 2, the memory cells 200 are shown to be arranged in a number of rows 230, 231, 232, along with access lines, for example word lines, to conduct signals such as signals WL0, WL1, and WL2. The memory cells are also shown to be arranged in a number of columns 240, 241, 242 along with data/sense lines, for example bit lines, to conduct signals such as signals BL0, BL1, and BL2. The access components 211 can turn on (e.g., by using appropriate values of signals WL0, WL1, and WL2) to allow access to the memory elements 222 to read information from or program (e.g., write) information into the memory elements 222.

Programming information into the memory elements 222 can include causing the memory elements 222 to have specific resistance values. Thus, reading information from the memory elements 222 can include measuring a resistance value of each of the memory elements 222. Measuring the resistance can include sensing a value of a current flowing through various ones of the memory cells 200. Based on a measured value of the current, a corresponding value of the information stored in the memory can be determined. A determination of the information based on the value of the current is discussed in more detail, below.

Figure 3:
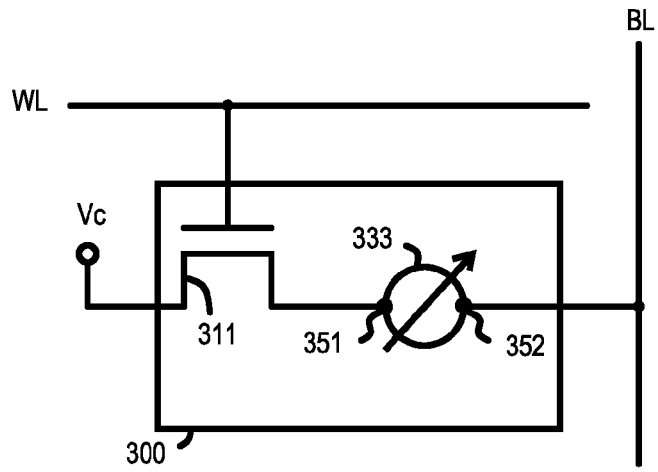
FIGS. 3 through 5 show schematic diagrams of examples of different memory cells having different access components coupled to memory elements, according to various embodiments.
Figure 4:
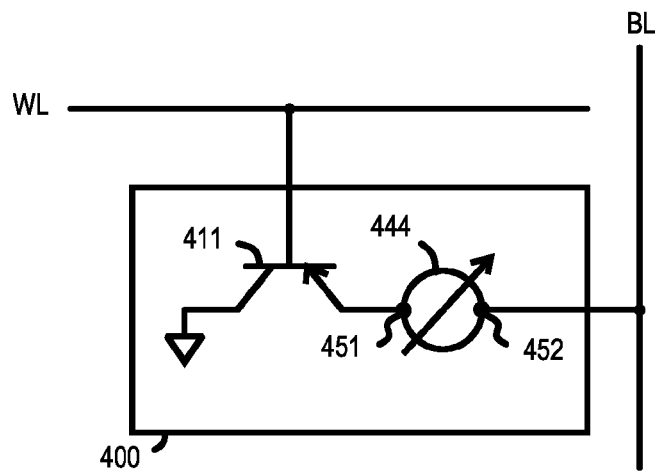
Figure 5:
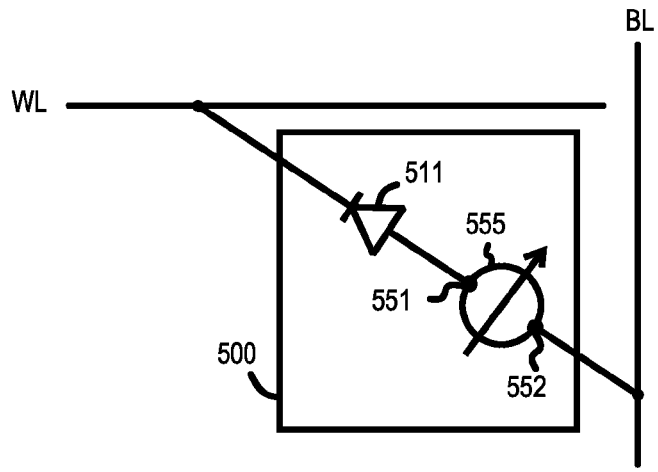

FIGS. 3 through 5 each show a schematic diagram of examples of different memory cells 300, 400, 500 having different access components 311, 411, 511 coupled to memory elements 333, 444, 555, according to various embodiments. Lines labeled WL and BL in FIGS. 3 through 5 can correspond to any one of the access lines 104 and any one of the first data lines 106 of FIG. 1, respectively. FIGS. 3 through 5 show examples of the access components 311, 411, 511 including a metal-oxide-semiconductor field-effect transistor (MOSFET), a bipolar junction transistor (BJT), and a diode, respectively. As will be realized by one of ordinary skill, upon reading this disclosure, the memory cells 300, 400, 500 can include other types of access components.

Each of the memory elements 333, 444, 555 can be coupled to and disposed between two electrodes, such as a first electrode 351 and a second electrode 352 (FIG. 3), a first electrode 451 and a second electrode 452 (FIG. 4), or a first electrode 551 and a second electrode 552 (FIG. 5). FIGS. 3 through 5 schematically show each of these electrodes as dots. Structurally, each of these electrodes can include a conductive material. Respective ones of the memory elements 333, 444, 555 can include a material that can be changed, for example, in response to a signal, to have different resistance values. The value of information stored in the memory element can correspond to the resistance value of the memory element. The access components 311, 411, 511 can enable signals (e.g., embodied as a voltage or current) to be transferred to and from the memory elements 333, 444, 555 via the respective pairs of electrodes during operation of the memory cells such as read, program, or erase operations.

A programming operation may use signal WL to turn on the access components 311, 411, 511, and then apply a signal (e.g., a signal having a programming voltage or current) through the memory elements 333, 444, 555. Such a signal can cause at least a portion of the material of the memory elements 333, 444, 555 to change. The change can be reversed by, for instance, performing an erase operation. For example, dielectrics can be created at or near surfaces of one or more metals within the memory elements through oxidation of the one or more metals. The oxidation process is discussed in more detail, below, for example, with reference to FIGS. 6A and 6B. The dimensions of these dielectrics can be changed in at least a portion of the memory elements 333, 444, 555 during a programming operation. Different dimensions, such as different thicknesses, of the dielectric may cause the memory elements 333, 444, 555 to have different resistance values. The differences in resistance values can be used to represent different states that represent different values of the information that is stored in the memory elements 333, 444, 555.

A read operation may use the signal WL to turn on the access components 311, 411, 511, and then apply a signal having a voltage or a current (e.g., a read voltage or current) through the memory elements 333, 444, 555. The read operation may measure the resistance of the memory cells 300, 400, 500, based on a read voltage or current, to determine the corresponding value of information stored therein. For example, in each of the memory cells 300, 400, 500, a different resistance value can impart a different value (e.g., voltage or current value) to signal BL when a read current passes through the memory elements 333, 444, 555. Other circuitry of the memory device (e.g., a circuit such as the I/O circuit 116 of FIG. 1) can use the signal BL to measure the resistance value of memory elements 333, 444, 555 to determine the value of the information stored therein.

The voltage or current used during a read, program, or erase operation can be different from one another. For example, in a programming operation, the value (e.g., the voltage) of the signal (e.g., the signal BL in FIG. 3 or FIG. 4 or the signal WL in FIG. 5) that creates a current flowing through the memory element can be sufficient to cause the material of at least a portion of the memory element to change. The change can alter the resistance value of the memory element to reflect the value of the information to be stored in the memory elements 333, 444, 555.

In a read operation, the value (e.g., the voltage) of the signal (e.g., the signal BL in FIG. 3 or FIG. 4 or the signal WL in FIG. 5) that creates a current flowing through the memory element can be sufficient to create the current but insufficient to cause any portion of the memory element to change. Consequently, the value of the information stored in the memory element can remain unchanged during and after the read operation.

In an erase operation, the voltage value of the signal (e.g., the signal BL in FIG. 3 or FIG. 4 or the signal WL in FIG. 5) can have an opposite polarity from the voltage used in a programming operation. The signal, creating a current in this case, can therefore change, or reset, the material of the memory element to its original state; for example, a state prior to any programming being performed on the memory cells.

Various ones or all of the memory cells 100, 200, 300, 400, 500 of FIGS. 1 through 5 can include a memory cell having a structure similar or identical to one or more of the memory cells described below.

Figure 6A:
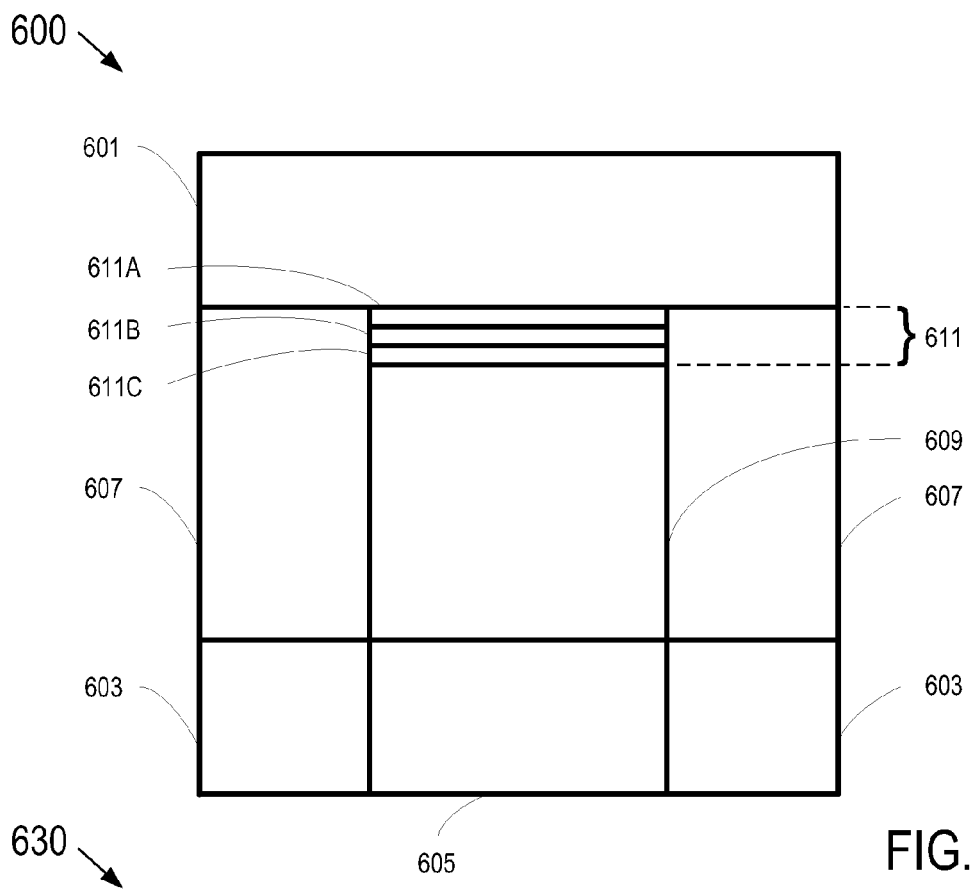
FIG. 6A shows a cross-sectional view of a portion of a memory cell, according to an example embodiment.

For example, FIG. 6A shows a cross-sectional view of a portion of a memory cell 600, according to an example embodiment. The material in the memory cell 600 can have different states to store information representing a single bit or multiple bits, as described in more detail below with reference to FIGS. 7A through 7E and FIGS. 8A through 8D.

With continued reference to FIG. 6A, the memory cell 600 is shown to include a top electrode 601, a first dielectric 603, a lower electrode 605, a second dielectric 607, a memory material 609, and a multi-layer stack electrode 611 disposed between the top electrode 601 and the memory material 609. In an example embodiment, the first dielectric 603 and the second dielectric 607 can each be fabricated from a variety of non-conductive materials including silicon dioxide ($SiO_2$), various types of silicon nitride ($Si_xN_y$), or other types of one or more dielectric materials known independently in the art. In other embodiments, the first dielectric 603 and the second dielectric 607 can be fabricated as a single continuous layer or as a series of layers. Details of exemplary fabrication processes are discussed in more detail, below, with reference to FIGS. 9A through 9F.

The top electrode 601 and the lower electrode 605 may each be fabricated from a number of conductive materials known in the art, and each electrode may be fabricated from the same material or from a different material. For example, the top electrode 601 and the lower electrode 605 can be fabricated from platinum (Pt), aluminum (Al), copper (Cu), tungsten (W), or a number of other conductive materials known independently in the art. The material chosen to fabricate the top electrode 601 and the lower electrode 605 can be an inert material, such that it may remain unchanged (e.g., the lower electrode 605 does not react with the memory material 609) when a signal is applied to the top electrode 601 (e.g., during programming of the memory cell 600). The top electrode 601 and the lower electrode 605 can each be deposited, sputtered, or otherwise formed onto a base material or substrate (not shown explicitly in FIG. 6A but discussed with reference to FIGS. 9A through 9F, below). As used herein, the term substrate is simply chosen to refer to any of various substrate types used in the semiconductor and allied industries. Substrate types may therefore include silicon wafers, compound wafers, thin film head assemblies, polyethylene-terephthalate (PET) films, photomask blanks and reticles, or numerous other types of substrates known independently in the art.

The memory material 609 may be comprised of a dielectric material, which may include a combination of materials, including oxygen. For example, the memory material 609 can include $Pr_xCa_yMn_zO$, $La_xCa_yMnO_z$, $La_xSr_yCo_xY$, $TiO_x$, $HfO_x$, $ZrO_x$, and other dielectric materials.

The multi-layer stack electrode 611 can be comprised of a number of different metals. The metals can include, for example, aluminum (Al), platinum (Pt), titanium (Ti), tungsten (W), titanium nitride (TiN), tantalum nitride (TaN), tungsten nitride ($WN_x$), tungsten oxide ($WO_x$), ruthenium (Ru), ruthenium oxide ($RuO_x$), hafnium silicide ($HfSi_x$), nickel silicide ($NiSi_x$), and other metals or materials. Each of a first metal 611A, a second metal 611B, and a third metal 611C of the multi-layer stack electrode 611 may include only a single element (e.g., only a single metal). For example, the first metal 611A may include only a single metal (e.g., only aluminum), the second metal 611B may include only a single metal (e.g., titanium) that is different from the metal of first metal 611A, and the third metal 611C may include only a single metal (e.g., tungsten) that is different from either the first 611A or the second 611B metals. Alternatively, one or more of the first 611A, second 611B, or third 611C metals can include only a single element (e.g., only a single metal) and the remaining metal or metals can include a combination (e.g., a compound) of two or more elements. Moreover, each of the 611A, second 611B, and third 611C metals can include a combination of two or more elements. For example, the first metal 611A can include a combination of two or more elements and the second 611B and third 611C metals can each include other combinations of two or more elements where the combinations are each different from one another. In other embodiments, alternating metals or metal combinations (e.g., the first metal 611A and the third metal 611C) can be the same as one another but different from the second metal 611B.

Although FIG. 6A shows that the multi-layer stack electrode 611 includes the first 611A, second 611B, and third 611C metals, the multi-layer stack electrode 611 can incorporate any number of metals. Thus, the three-metal stack shown in FIG. 6A is merely provided as an example. Each of the metals in the multi-layer stack electrode 611 may be deposited or otherwise formed by, for example, atomic layer deposition (ALD), chemical vapor deposition (CVD), physical vapor deposition (PVD), or a number of other techniques and formation processes know independently in the semiconductor and related industries. In one embodiment, each of the metals in the multi-layer stack electrode 611 is deposited by ALD to a few monolayers in thickness. The ALD process allows a single monolayer of material to be formed at a time.

Each of the first 611A, second 611B, and third 611C metals may physically contact each other, but they may or may not chemically bond to one another. For example, the first 611A, second 611B, and third 611C metals of the multi-layer stack electrode 611 may not be, either partially or fully, bonded to one another as an alloy or compound. As shown with reference to FIG. 6A, the third metal 611C is electrically coupled to and can be at least partially in physical contact with the memory material 609. The first metal 611A is electrically coupled to and can be at least partially in physical contact with the top electrode 601.

These direct contacts allow each of the first 611A, second 611B, and third 611C metals to react with the memory material 609 during an operation (e.g., a program, read, or erase operation) of the memory cell 600, perhaps allowing the memory cell 600 to have different states. For example, a positive voltage applied to the top electrode 601 may induce oxidation of the metal near an interface of one or more layers of the multi-layer stack electrode 611 and the memory material 609. A large Gibbs free energy of oxidation results in a higher driving force towards oxide formation. The oxidation results in a resistive oxide layer that dominates an overall resistance of the memory cell 600 (as measured from the top electrode 601 to the lower electrode 605), thereby switching the memory cell 600 into a more resistive state. As discussed below, the oxidation process is reversible. The resistive states can be used to represent different values of information stored in the memory cell 600. A more detailed description of the various states is provided, below, with reference to FIGS. 7A through 7E and FIGS. 8A through 8D.

Figure 6B:
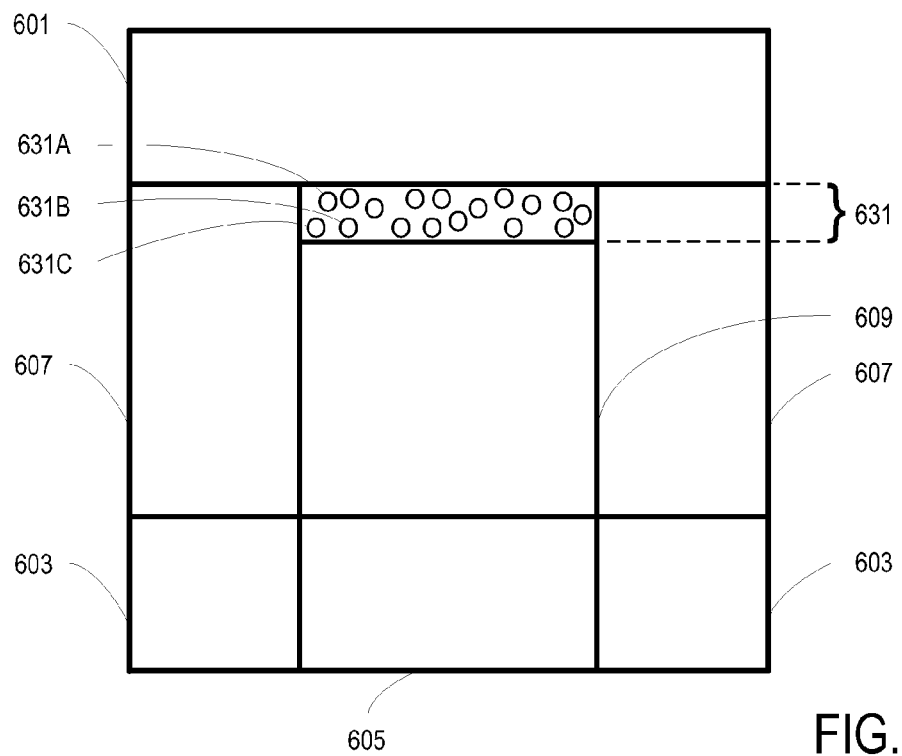
FIG. 6B shows an alternative cross-sectional view of a portion of a memory cell, according to an example embodiment.

With reference now to FIG. 6B, an alternative cross-sectional view of a portion of a memory cell 630 is shown, according to an example embodiment. Similar to the memory cell 600 of FIG. 6A, the material in the memory cell 630 can have different states to store information representing a single bit or multiple bits. However, rather than the multi-layer stack electrode 611 construction of the memory cell 600 of FIG.

6A, the memory cell 630 of FIG. 6B is shown to include a mixed layer electrode 631. As described in more detail, below, the mixed layer electrode 631 of FIG. 6B functions in a manner similar or identical to the multi-layer stack electrode 611 of FIG. 6A. Although the mixed layer electrode 631 is shown to include a first 631A, a second 631B, and a third 631C metal particle type, any number of particle types may be used.

The mixed layer electrode 631 of FIG. 6B is comprised of a number of different metal particles. In an embodiment, the metal particles may be in physical contact with one another. In other embodiments, the metal particles may be isolated from one another by an intervening dielectric material formed between at least some of the metal particles; that is, a colloidal system (i.e., dispersed phase metal particles in a dielectric continuous medium). In other embodiments, the metal particles are randomly dispersed in the colloidal system. In still other embodiments, a combination of metal particles in contact with one another and the colloidal system may be used.

As with the multi-layer stack electrode 611 of FIG. 6A, the mixed layer electrode 631 can include metal particles selected from a plurality of metals. For example, the metals can include aluminum (Al), platinum (Pt), titanium (Ti), tungsten (W), titanium nitride (TiN), tantalum nitride (TaN), tungsten nitride ($WN_x$), tungsten oxide ($WO_x$), ruthenium (Ru), ruthenium oxide ($RuO_x$), hafnium silicide ($HfSi_x$), nickel silicide ($NiSi_x$), and other metals or materials. Each of the first 631A, second 631B, and third 631C metal particle type of the mixed layer electrode 631 may include only a single element (e.g., only a single metal). For example, the first metal particle type 631A may include only a single metal (e.g., only aluminum), the second metal particle type 631B may include only a single metal (e.g., titanium) that is different from the metal of first metal particle type 631A, and the third metal particle type 631C may include only a single metal (e.g., tungsten) that is different from either the first 631A or the second 631B metal particle types. Alternatively, one or more of the first 631A, second 631B, or third 631C metal particle types can include only a single element (e.g., only a single metal) and the remaining particle or particles can include a combination (e.g., a compound) of two or more elements. Moreover, each of the 631A, second 631B, and third 631C metal particle type can include a combination of two or more elements. For example, the first metal particle type 631A can include a combination of two or more elements and the second 631B and third 631C metal particle types can each include other combinations of two or more elements that are each different from one another. In other embodiments, alternating metals or metal combinations (e.g., the first metal particle type 631A and the third metal particle type 631C) can be the same as one another but different from the second metal particle type 631B.

FIGS. 7A through 7E show a memory cell 700 having various states and resistivity values, according to an example embodiment. The memory cell 700 is similar to the memory cell 600 of FIG. 6A or the memory cell 630 of FIG. 6B except for the number of metal layers within a two-layer stack electrode 711 as shown in FIGS. 7A through 7E. The two-layer stack electrode 711 has a first metal 713A and a second metal 715A. The first 713A and the second 715A metals can be formed similarly and from similar or the same materials as the first 611A, second 611B, and third 611C metals of FIG. 6A.

Thus, the two-layer stack electrode 711 has only two metals as compared with the three metals of the multi-layer stack electrode 611 or the three metal particle types of the mixed layer electrode 631 of FIG. 6B. The practical difference between the two examples is the number of available states, which depends on the number of metal types. For example, in some embodiments, two metal types can yield four states (i.e., $2^2=4$), three metal types can yield eight states (i.e., $2^3=8$), four metal types can yield sixteen states (i.e., $2^4=16$), and so on. Thus, the two-layer stack electrode 711 is described for reasons of brevity. Upon reading this disclosure, one of ordinary skill in the art will understand how to apply the techniques described to more than two metal types, to construct and operate a memory cell with more than four corresponding available states.

Figure 7A:
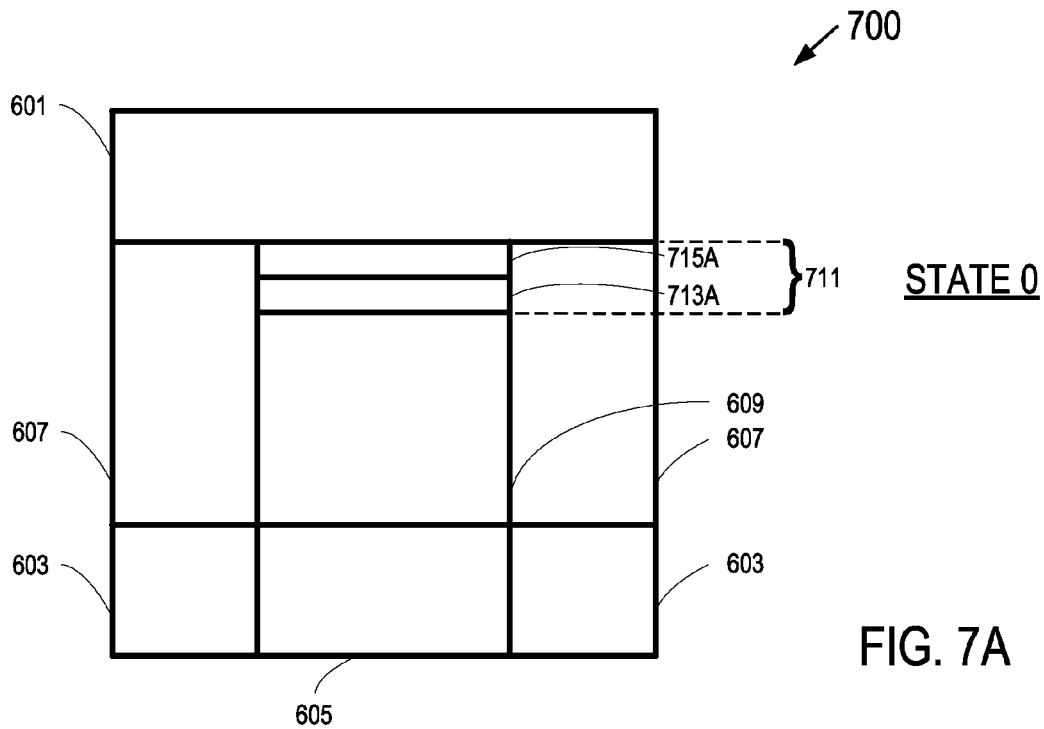
FIGS. 7A through 7E show a memory cell having various states and resistivity values, according to an example embodiment.

With continuing reference to FIG. 7A, under a certain condition, such as under the application of a signal in the form of a bias voltage (discussed with reference to FIGS. 7B through 7E) applied to the top electrode 601 during a programming operation performed on the memory cell 600, the first 713A and the second 715A metals of the two-layer stack electrode 711 can react with the memory material 609. As described below, the reaction between the materials can create a dielectric material from one or both of the first 713A and the second 715A metals and the memory material 609. The presence or absence of the dielectric material or a change in the dimension (e.g., thickness) of the dielectric material can cause the memory cell 700 to have different memory states due to different resistance values caused by the presence/absence or various thicknesses of the one or more dielectric materials.

FIGS. 7A through 7D show four example states in the memory cell 700, including state 0, state 1, state 2, and state 3. Each of these states can be created by applying different bias voltage levels to the top electrode 601 during a memory operation, such as a programming operation.

In FIG. 7A, no bias voltage is applied (i.e., the bias voltage is approximately zero) and, consequently, no dielectric material is created in the memory material 609. Thus, in this example, the memory cell 700 is at a state 0.

Figure 7B:
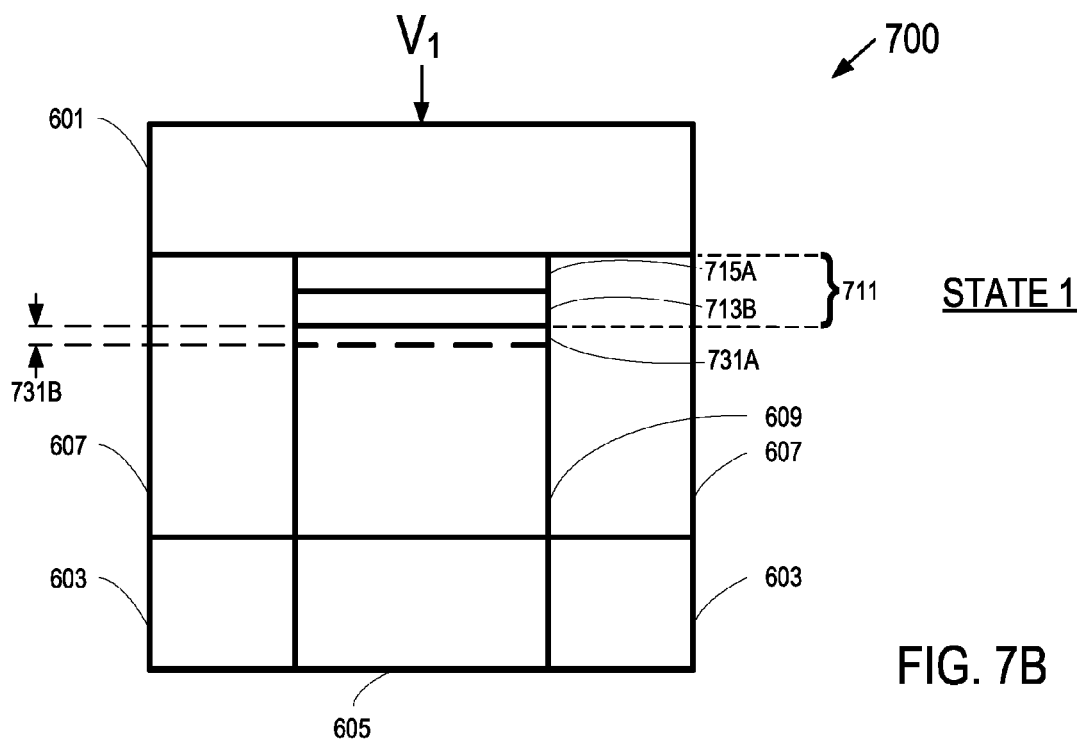

In FIG. 7B, and with continuing reference to FIG. 7A, in response to applying a sufficient bias voltage $V_1$ (e.g., a sufficient magnitude of a positive voltage $V_1$) to the top electrode 601, the two-layer stack electrode 711 can react with the memory material 609 to create a dielectric material 731A having a thickness 731B between the two-layer stack electrode 711 and the memory material 609. The first metal 713A or FIG. 7A may be partially consumed to form a first metal 713B and a portion of the dielectric material 731A of FIG. 7B. Thus, the dielectric material 731A is at least partially an oxide of the first metal 713B. The first metal 713B is similar to the first metal 713A but is partially consumed by an interaction with oxygen. The oxygen in the dielectric material 731A is provided by the memory material 609. For example, in response to the signal having a sufficient positive voltage (e.g., the bias voltage $V_1$), negative oxygen ions from the memory material 609 diffuse to the two-layer stack electrode 711 and react with the first metal 713A of FIG. 7A. The dielectric material 731A therefore directly contacts the first metal 713B.

As a result of the sufficient bias voltage $V_1$ being applied to the memory cell 700 at the top electrode 601, the dielectric material 731A in FIG. 7B changes the structure of at least a portion of the memory material 609 relative to the structure shown in FIG. 7A. Thus, the state of the memory cell 700 can also change, such as from state 0 (FIG. 7A) to state 1 (FIG. 7B) due to an increased resistance in the memory cell 700. The increased resistance, as measured from the top electrode 601 to the lower electrode 605, is due to the formation of the dielectric material 731A.

With reference again to FIG. 7A, the application of a sufficient bias voltage may create a dielectric material based on only the first metal 713A and not the second metal 715A. The formation of any dielectric material is attributable to the first 713A and the second 715A metals being different from one another. Different materials (e.g., different metals) have different propensities to form oxide, based on, for example, the Gibb's free energy of oxide formation for each material. Thus, if the first metal 713A (e.g., aluminum) is more reactive to oxide formation than the second metal 715A (e.g., titanium), then for a given voltage (e.g., $V_1$) only a certain thickness of oxide may be generated. In this example, for the same bias voltage $V_1$, no oxide material (e.g., no oxide of titanium) may be created. However, if a voltage applied to the top electrode 601 is increased (e.g., to a voltage greater than $V_1$), then additional dielectric materials may also be created between portions of the second metal 715A and the memory material 609. In some embodiments, the potential of bias voltages for voltage $V_1$ include about 1 volt but can range from about 0 volts to about 5 volts.

Figure 7C:
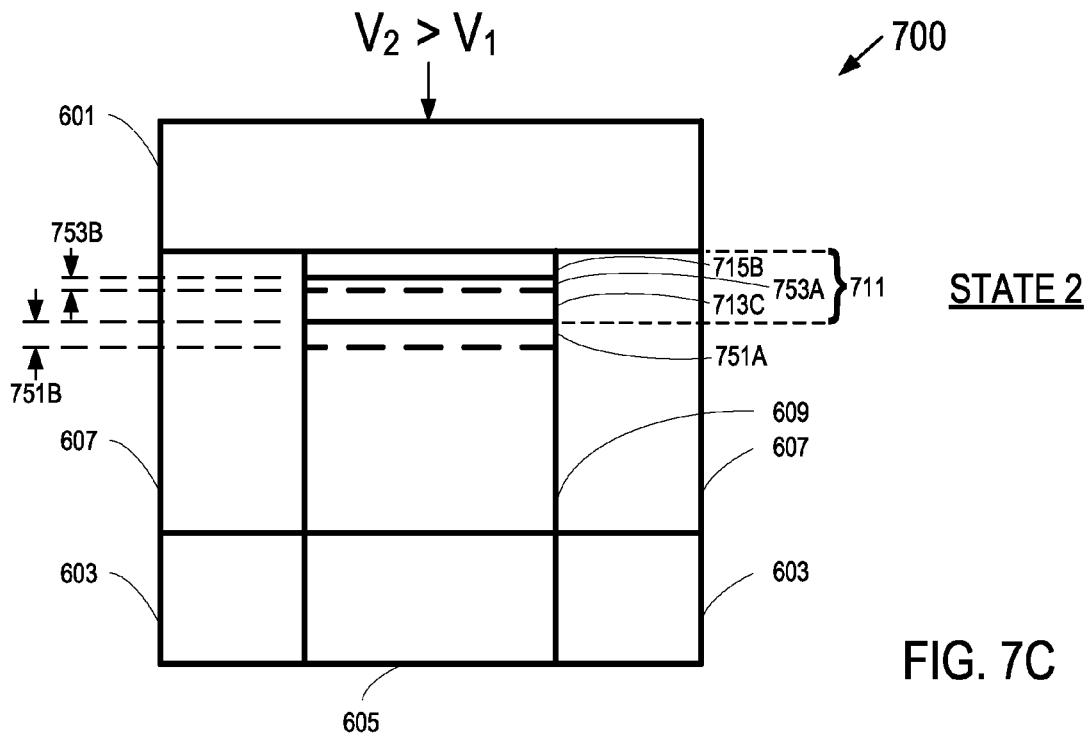

Referring now to FIG. 7C, in response to a sufficient bias voltage $V_2$ (e.g., a positive bias voltage $V_2$ greater than the bias voltage V1 of FIG. 7B) applied to the top electrode 601, the second metal 715B of the two-layer stack electrode 711 may react with the memory material 609 to create a second dielectric material 753A. The second dielectric material 753A has a second thickness 753B. Additionally, a first dielectric material 751A has a first thickness 751B greater than the thickness 731B of the dielectric material 731A of the memory cell 700 of FIG. 7B. The dielectric material 731A was formed by application of the bias voltage $V_1$. Thus, in response to the sufficient bias voltage $V_2$, negative oxygen ions from the memory material 609 diffused to the two-layer stack electrode 711 and reacted with the first 713C and second 715B metals. The reaction created oxide of material comprising the first 751A and second 753A dielectric materials. In some embodiments, the potential of bias voltages for voltage $V_2$ include about 1.4 volts but can range from about 0 volts to about 5 volts.

The additional thickness on the first dielectric material 751A is due to more oxygen ions being attracted to the increased potential of $V_2$ over $V_1$, caused by the application of the bias voltage $V_2$ in FIG. 7C. However, in some situations, depending at least partially on a composition of the memory material 609, the application of the bias voltage $V_1$ of FIG. 7B may saturate the oxidation mechanism for forming the dielectric material 731A. When the oxidation mechanism is saturated, the application of an increased bias potential, for example, bias voltage $V_2$ of FIG. 7C to the top electrode 601, may cause the first thickness 751B of the first dielectric material 751A to be close to or substantially the same thickness as the thickness 731B of the dielectric material 731A of FIG. 7B.

The formation of the first 751A and the second 753A dielectric materials of FIG. 7C change the structure of the memory material 609 relative to the structures of the memory cell 700 shown in either FIG. 7A or FIG. 7B. Thus, the state of memory cell 700 can also change, such as from state 1 (FIG. 7B) to state 2 (FIG. 7C) due to an increased resistance in the memory cell 700. The increased resistance, as measured from the top electrode 601 to the lower electrode 605, is due to the formation of the first 751A and the second 753A dielectric materials.

Figure 7D:
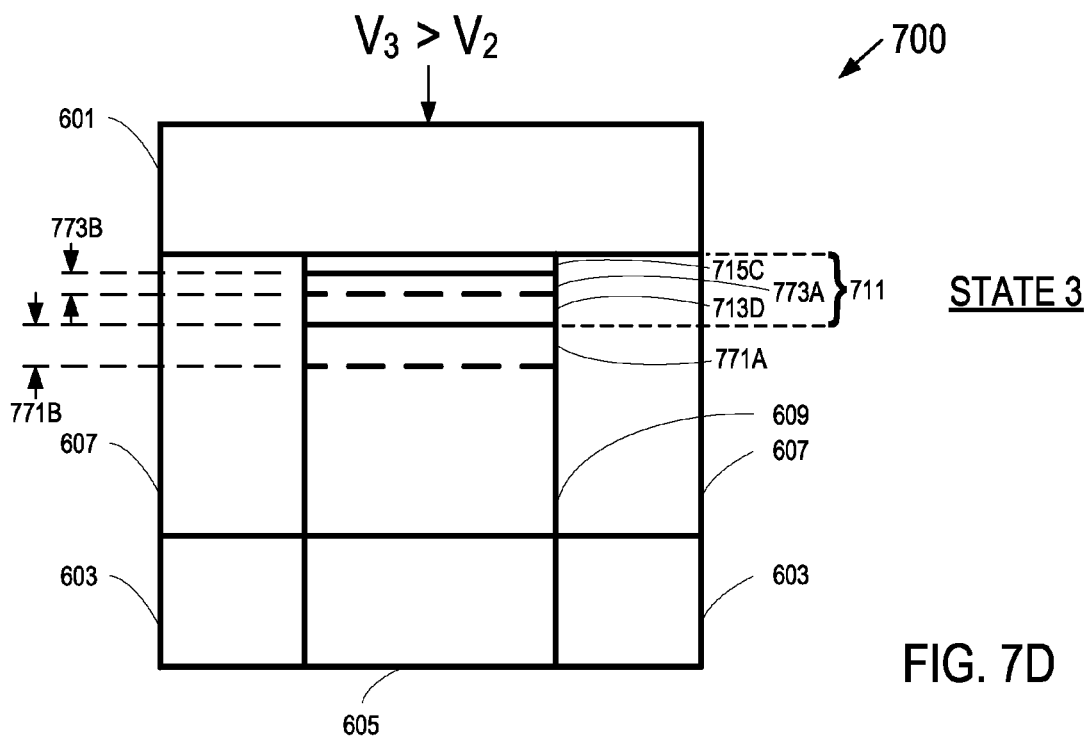

In FIG. 7D, in response to a sufficient bias voltage V3 (e.g., a positive bias voltage $V_3$ greater than the bias voltage $V_2$ of FIG. 7C) applied to the top electrode 601, the second metal 715C of the two-layer stack electrode 711 may react with the memory material 609 to create a second dielectric material 773A. The second dielectric material 773A has a second thickness 773B. Additionally, a first dielectric material 771A has a first thickness 771B greater than the first thickness 751B of the first dielectric material 751A of the memory cell 700 of FIG. 7C. The first dielectric material 751A (FIG. 7C) was formed by application of the bias voltage $V_2$. Thus, in response to the sufficient bias voltage $V_3$, negative oxygen ions from the memory material 609 diffused to the two-layer stack electrode 711 and reacted with the first 713D and the second 715C metals. The reaction created oxides of material comprising the first 771A and second 773A dielectric materials. In some embodiments, the potential of bias voltages for voltage $V_3$ include about 1.4 volts but can range from about 0 volts to about 5 volts.

The additional thickness on the first dielectric material 771A is due to more oxygen ions being attracted to the increased potential of $V_3$ over $V_2$ caused by the application of the bias voltage $V_3$ in FIG. 7D. However, in some situations, depending at least partially on a composition of the memory material 609, the application of the bias voltage $V_1$ of FIG. 7B or $V_2$ of FIG. 7C may saturate the oxidation mechanism for forming the dielectric material 731A of FIG. 7B or the first dielectric material 751A of FIG. 7C. When the oxidation mechanism is saturated, the application of an increased bias potential, for example, bias voltage $V_3$ of FIG. 7D to the top electrode 601, may cause the first thickness 771B of first dielectric material 771A to be close to or substantially the same thickness as the first thickness 751B of the first dielectric material 751A of FIG. 7C.

The formation of the first 771A and the second 773A dielectric materials of FIG. 7D change the structure of the memory material 609 relative to the structures of the memory cell 700 shown in any of FIG. 7A, 7B, or 7C. Thus, the state of memory cell 700 can also change, such as from state 2 (FIG. 7C) to state 3 (FIG. 7D) due to an increased resistance in the memory cell 700. The increased resistance, as measured from the top electrode 601 to the lower electrode 605, is due to the formation of the first 771A and the second 773A dielectric materials.

As described, above, with reference to FIGS. 6A and 6B, the material of the lower electrode 605 can be an inert material. Thus, selecting the lower electrode to be formed from an inert material can prevent or reduce reactions between the lower electrode 605 and the memory material 609 during application of a bias voltage to the top electrode 601. Consequently, during the applications of the bias voltages $V_1$, $V_2$, or $V_3$ to the top electrode 601, as shown in FIGS. 7B through 7D, respectively, no dielectric materials may be created at the interface between the lower electrode 605 and the memory material 609. Therefore, the lower electrode 605 can remain directly contacting the memory material 609 without a necessity for a dielectric material between the lower electrode 605 and the memory material 609.

The application of the signals in the form of bias voltages $V_1$, $V_2$, or $V_3$ to create various ones of the dielectric materials between the interface of the multi-layer stack electrode 611 or the mixed layer electrode 631, of FIGS. 6A and 6B, respectively, and the memory material 609, as described above with reference to FIGS. 7A through 7D, can be applied during a programming operation. Although FIGS. 7A through 7D are only described in detail with reference to the multi-layer stack electrode 611, one of ordinary skill in the art, upon reading this disclosure, will understand how the same or similar techniques are applicable with reference to the mixed layer electrode 631 of FIG. 6B.

Figure 7E:
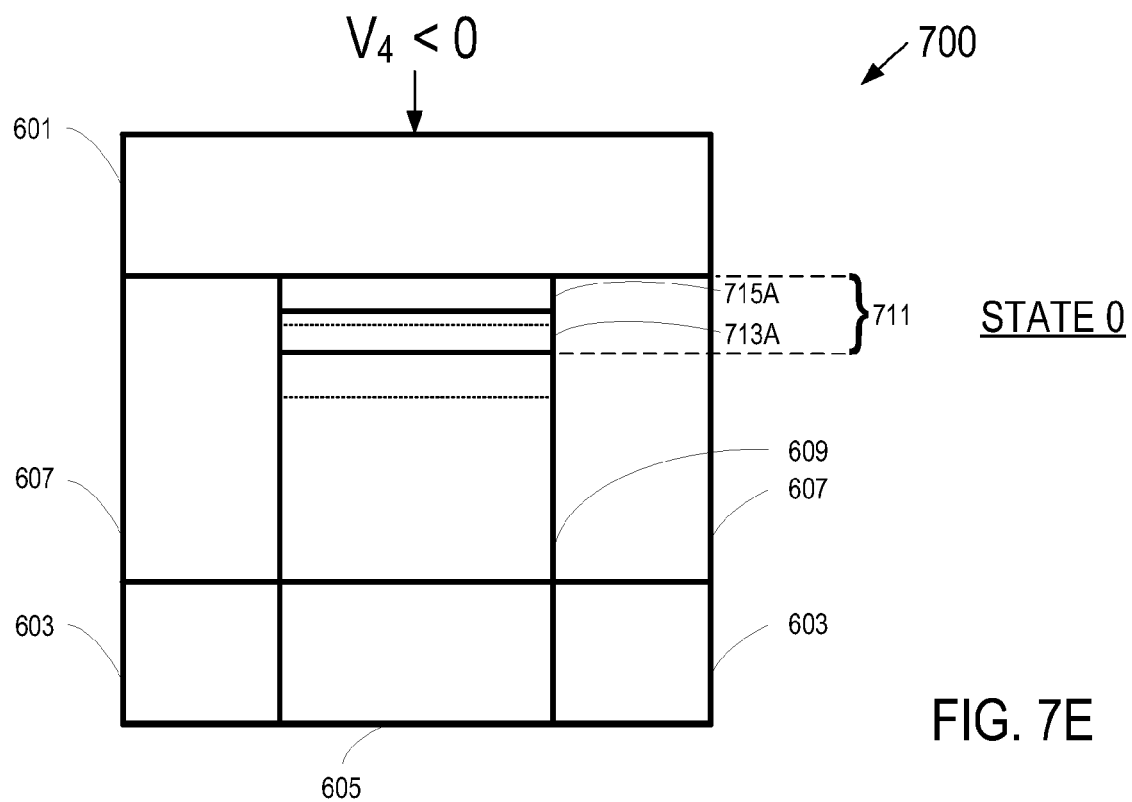
Figure 8A:
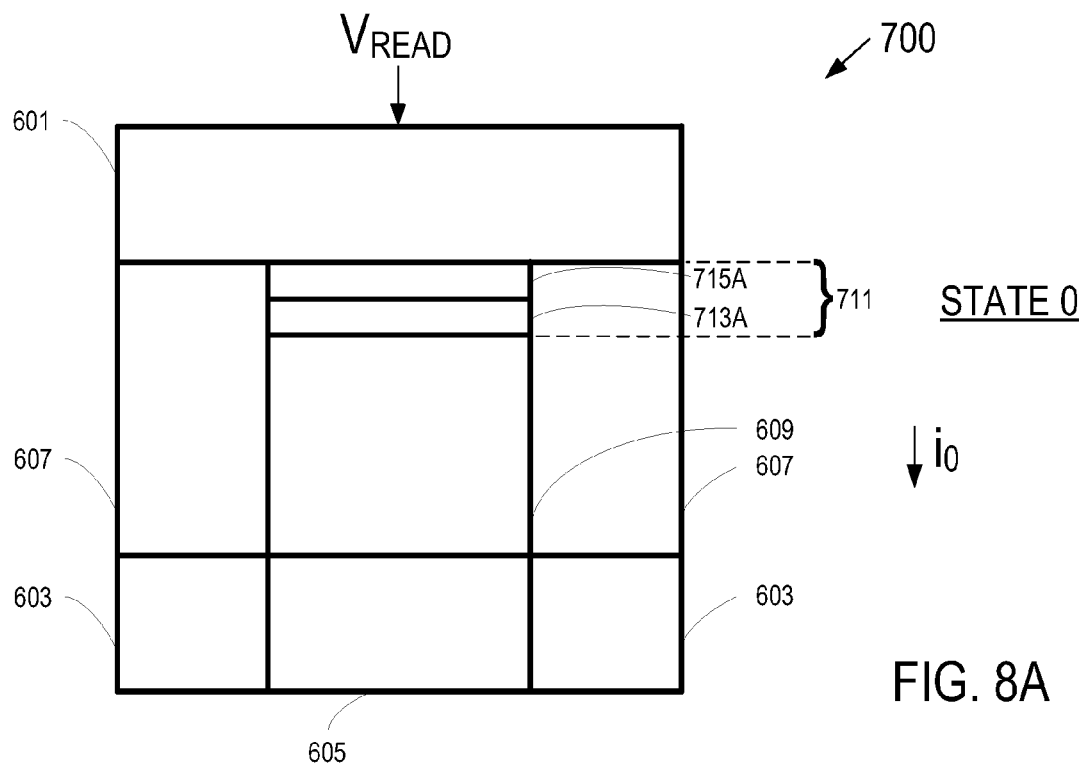
FIGS. 8A through 8D show the memory cell of FIGS. 7A through 7D having different values of currents flowing from a top electrode to a lower electrode in various read operations, according to an example embodiment.
Figure 8B:
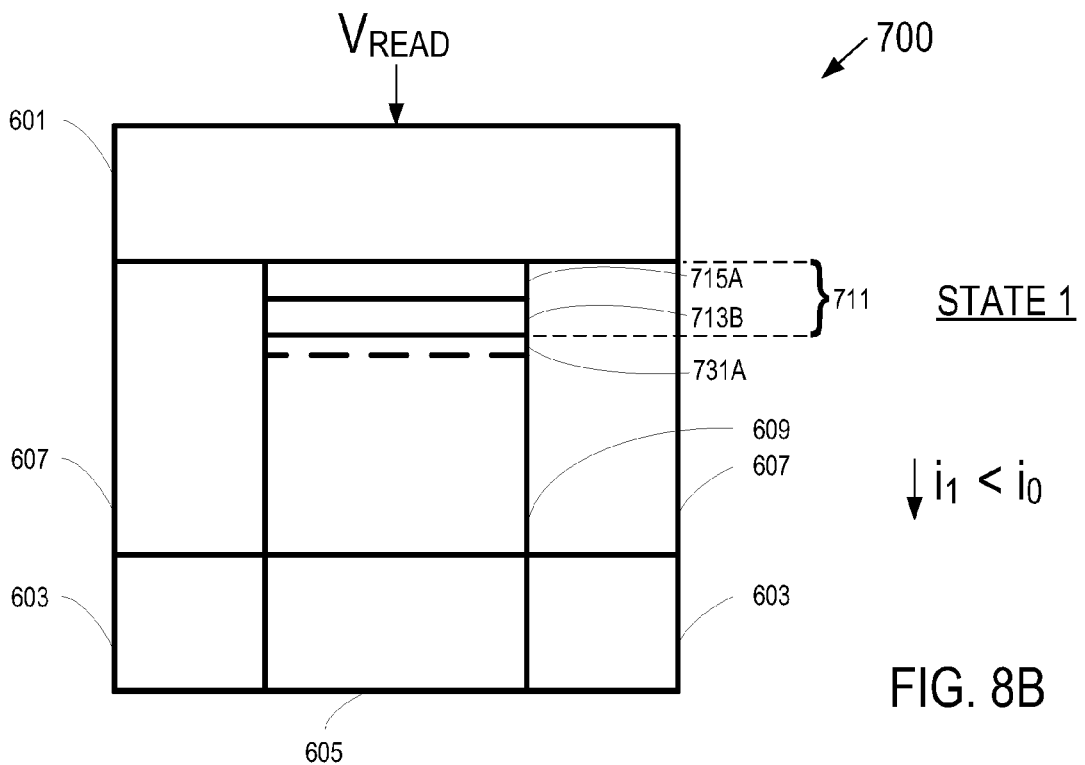
Figure 8C:
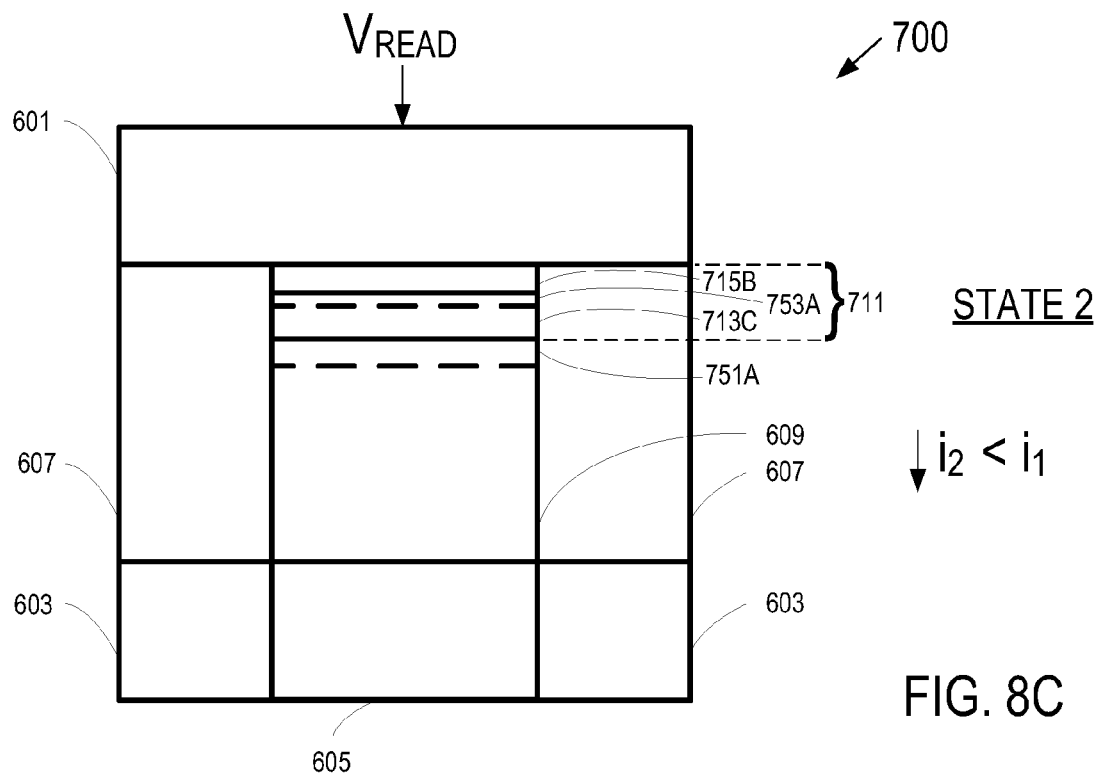
Figure 8D:
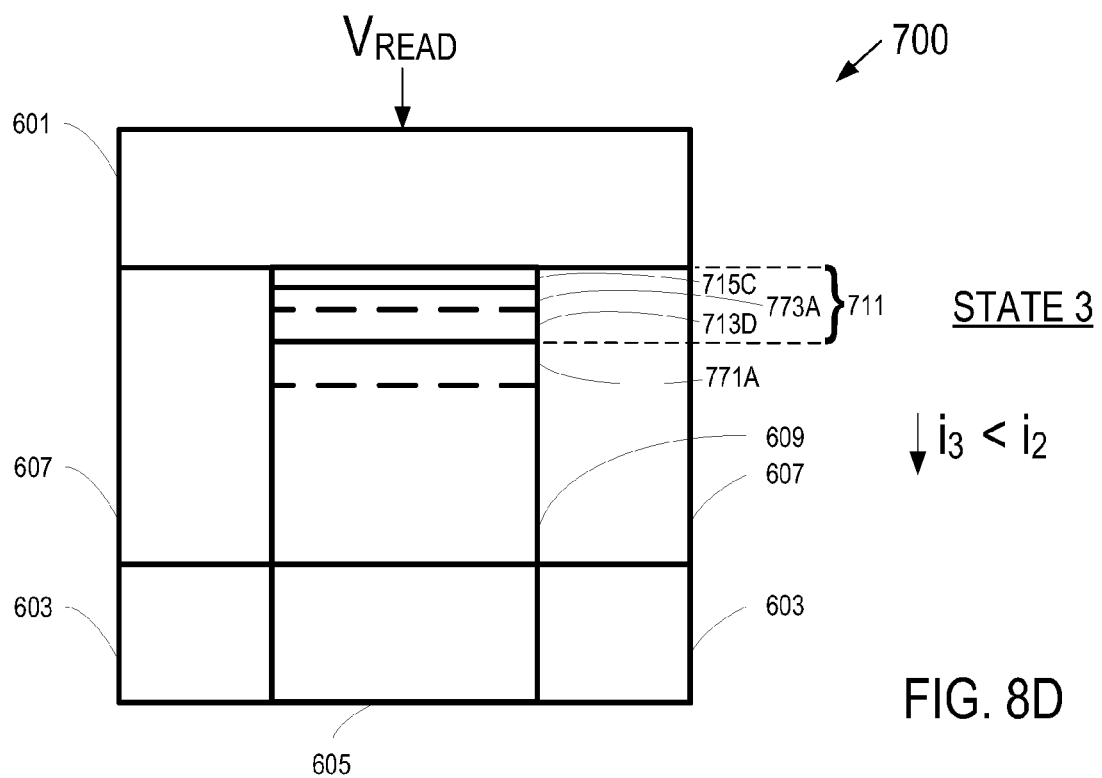

With reference now to FIG. 7E, a signal in the form of a bias voltage $V_4$ with a polarity that is opposite to that of $V_1$, $V_2$, or $V_3$ (e.g., negative) is applied to the top electrode 601. A sufficient negative bias voltage $V_4$ can reduce the thickness of some or all of dielectric materials previously formed with reference to FIGS. 7B through 7D. Thus, the application of the negative bias voltage $V_4$ can be applied to the top electrode 601 during an erase operation. In response to the sufficiently negative bias voltage $V_4$ being applied to the top electrode 601, negative oxygen ions from the various dielectric materials may diffuse to the memory material 609, thereby reducing the thickness of the dielectrics. If the negative voltage at the top electrode 601 is sufficiently large, the negative voltage may dissolve the dielectric materials. Consequently, the memory cell 700 may return to its original state (e.g., state 0) once the dielectric materials are sufficiently reduced in thickness or dissolved. In some embodiments, the potential of bias voltages for voltage $V_4$ include about 2 volts to full erase For example, if the memory cell 700 is in any of state 1 (FIG. 7B), state 2 (FIG. 7C), or state 3 (FIG. 7D), the application of the bias voltage $V_4$ (e.g., with a polarity that is opposite to that of $V_1$, $V_2$, or $V_3$ and thus, sufficiently negative) to the top electrode 601 can reduce the thickness of or dissolve the formed dielectric materials between the top electrode 601 and the memory material 609 in these states. In this example, the memory cell 700 can return from state 1, state 2, or state 3 back to state 0 as shown in FIG. 7E. State 0 of FIG. 7E is the same state of the memory cell 700 of FIG. 7A, where substantially no dielectric materials are present in the memory material 609.

As described above, the various states, such as states 0, 1, 2, and 3 of the memory cell 700, can each be used to represent information stored in the memory cell 700. For example, the memory cell 700 can be used as a non-volatile two-bit memory cell. States 0, 1, 2, and 3, as described above, can be used to represent four possible combinations of the two bits.

Also as described above, the embodiments depicted in FIGS. 7A through 7D show the formation of four states 0, 1, 2, and 3 of the memory cell 700. However, any other number of states can be formed, by applying different signals having different voltage values to create different states. For examples, if the two-layer stack electrode had been fabricated with three rather than two metals, eight signals (or a single signal) having eight different voltages can be applied to the top electrode 601 to create eight corresponding different states in the memory cell 700. The eight different states can be used to represent eight different possible combinations of three bits. In this example, the memory cell 700 can be used as a non-volatile three-bit memory cell.

The state of the memory cell 700, such as states 0, 1, 2, and 3, can be formed during the programming of the memory device (e.g., the memory device 101 of FIG. 1) in which the memory cell 700 resides. The information stored therein can then be retrieved during a read operation.

FIGS. 8A through 8D show the memory cell 700 of FIGS. 7A through 7D, respectively, having different values of currents $i_0$, $i_1$, $i_2$, and $i_3$ flowing from the top electrode 601 to the lower electrode 605 in various read operations. The current is produced in response to a signal having a voltage $V_{read}$ being applied to the top electrode 601, according to an example embodiment. The application of the signal having voltage $V_{read}$ can be applied to the multi-layer stack electrode 611 during, for example, a read operation.

As shown in FIGS. 8A through 8D, the memory material 609 has zero or more dielectric materials, the dielectric materials having different thicknesses as noted with reference to FIGS. 7A through 7D. As a result of the different dielectric materials, the memory cell 700 can have different resistance values in each of FIGS. 8A through 8D.

For example, based on the thickness of the various dielectric materials, the resistance value in state 0 is less than the resistance value in state 1; the resistance value in state 1 is less than the resistance value in state 2; and the resistance value in state 2 is less than the resistance value in state 3. As a result, the resistance value of the memory cell 700 is different in different states. Since the value of current through the memory cell 700 is inversely proportional to the differing resistances value of the memory cell 700 in the various states, each of the currents $i_0$, $i_1$, $i_2$, and $i_3$ have different values. Thus, $i_1$ is less than $i_0$, $i_2$ is less than $i_1$, and $i_3$ is less than $i_2$.

The value of $V_{read}$ can be selected to be sufficient to create measurable currents $i_0$, $i_1$, $i_2$, and $i_3$, but insufficient to cause any portion of the memory material 609 to change. For example, the value of voltage $V_{read}$ can be selected such that the thicknesses of the various dielectric materials remain unchanged. Consequently, the information stored in the memory cell 700 can remain unchanged during and after the read operation.

Figure 9A:
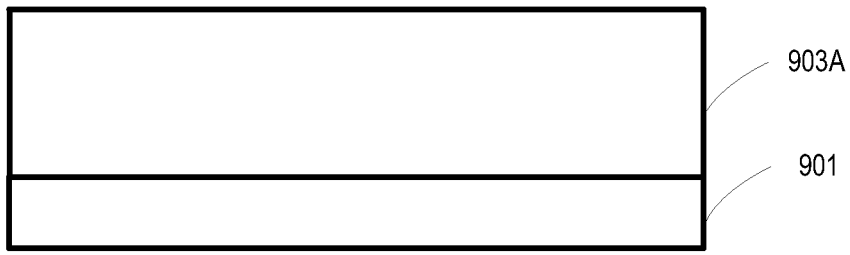
FIGS. 9A through 9F show various portions of a fabrication process to form a memory cell, according to an example embodiment.

FIGS. 9A through 9F show various parts of a fabrication process to form a memory cell, according to an example embodiment. In FIG. 9A, a dielectric material 903A is deposited, thermally grown, sputtered or otherwise formed on a substrate 901. The substrate 901 can include, for example, any of various substrate types used in the semiconductor and allied industries. Substrate types may therefore include silicon wafers, compound wafers, thin film head assemblies, polyethylene-terephthalate (PET) films, photomask blanks and reticles, or numerous other types of substrates known independently in the art.

The dielectric material 903A can include, for example, silicon dioxide ($SiO_2$), silicon nitride ($Si_3N_4$), or a number of other types of dielectric material or materials independently known to a skilled artisan. In other embodiments, the dielectric material 903A may consist of several dielectric layers.

Figure 9B:
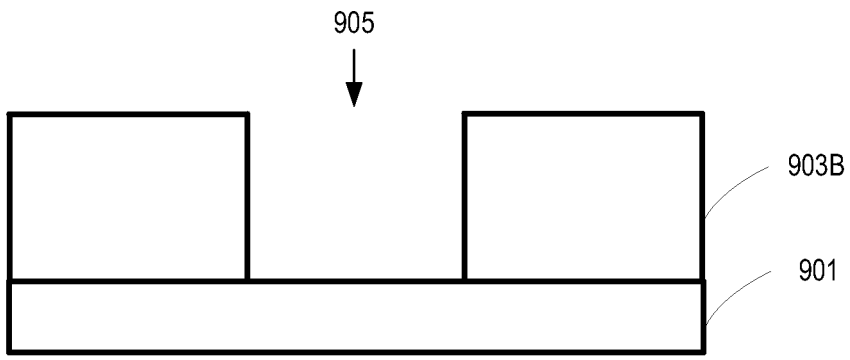

In FIG. 9B, the dielectric material 903A of FIG. 9A has been etched or otherwise partially opened thus forming an opened dielectric 903B. An aperture 905 in the opened dielectric 903B can take on a number of geometries. For example, in one embodiment, the aperture has a circular shape (as seen from a plan-view—not shown). In another embodiment, the aperture 905 may comprise a trench having substantially parallel sides.

Figure 9C:
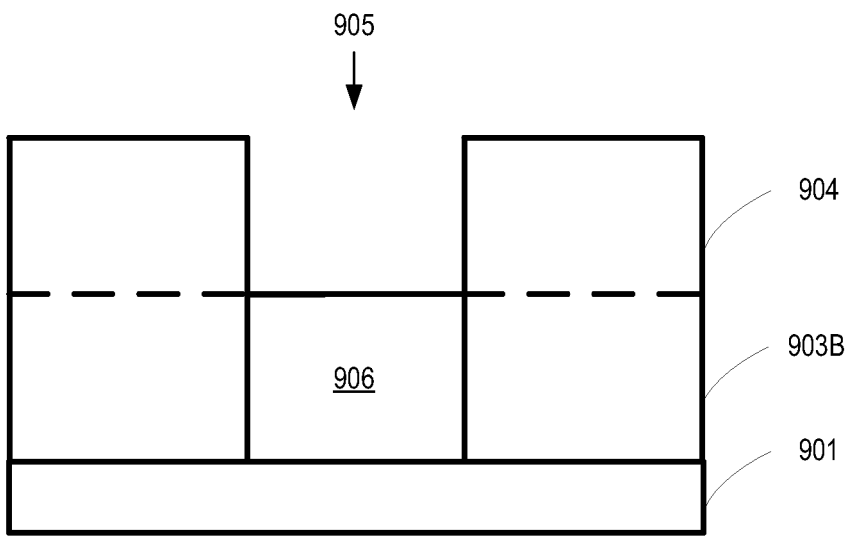

In FIG. 9C, the aperture 905 is at least partially filled with an electrode material 906. The electrode material 906 can be comprised of any of the materials described, above, with reference to the lower electrode 605 or the top electrode 601 of FIGS. 6A and 6B.

In an embodiment, the electrode material 906 can completely fill the aperture 905. In this embodiment, the electrode material 906 may then be planarized (by, for example, chemical mechanical planarization (CMP)) to be substantially coplanar with an upper surface of the opened dielectric 903B. In this embodiment, an additional opened dielectric 904 may subsequently be formed above the opened dielectric 903B and the upper surface of the electrode material 906.

In an alternative embodiment, the electrode material 906 only partially fills the aperture 905. In this embodiment, a remaining, unfilled portion of the aperture 905 is used in subsequent fabrication process activities.

In other embodiments, the substrate 901 may instead be comprised of one or more materials similar to the lower electrode 605 or the top electrode 601 of FIGS. 6A and 6B. In this embodiment, the process activities associated with FIG. 9C are optional as the electrode material 906 is already formed (i.e., as the substrate 901).

Figure 9D:
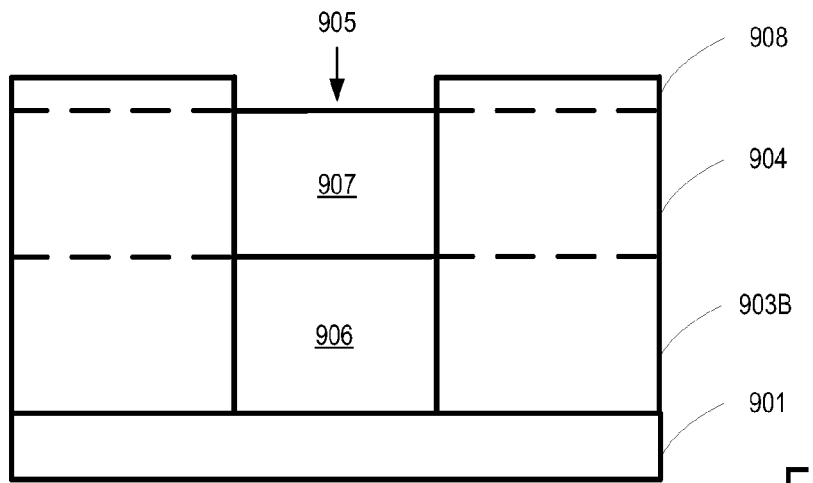

In FIG. 9D, the aperture 905 is at least partially filled with a memory material 907. The memory material 907 can be comprised of any of the materials described, above, for the memory material 609.

In an embodiment, the memory material 907 can fill any remaining portion of the aperture 905 left unfilled by the electrode material 906. In this embodiment, the memory material 907 may then be planarized (by, for example, chemical mechanical planarization (CMP)) to be substantially co-planar with an upper surface of the opened dielectric 903B. In this embodiment, another opened dielectric 908 may then be formed above the opened dielectric 903B and the upper surface of the memory material 907.

In an alternative embodiment, the memory material 907 only partially fills the aperture 905. In this embodiment, a remaining portion of the aperture 905 is used in subsequent fabrication process activities.

Figure 9E:
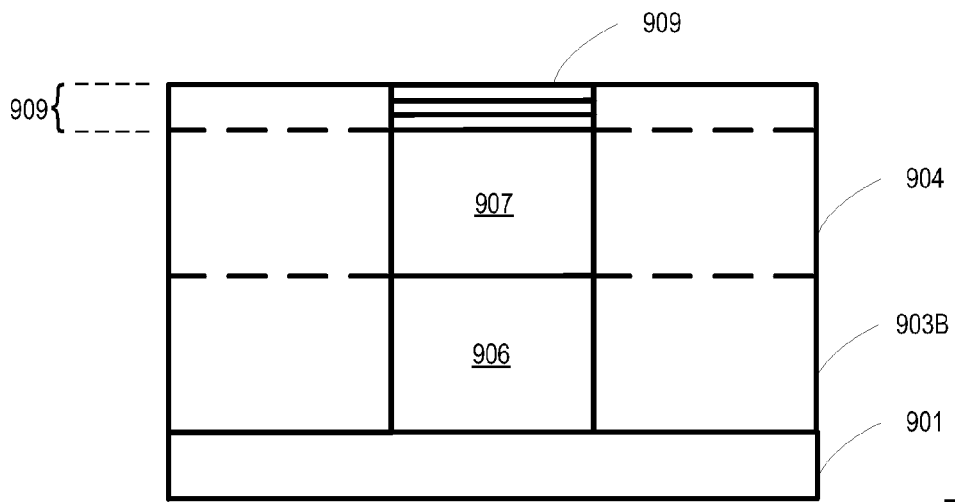

With reference to FIG. 9E, a multi-metal electrode 909 is formed above the memory material 907. The multi-metal electrode 909 can be formed either within the newly formed aperture formed above the opened dielectric 903B and the upper surface of the memory material 907, or within any remaining portion of the aperture 905.

In an embodiment, the multi-metal electrode 909 is fabricated by two or more sequential depositions or other formation techniques of two or more metals. This embodiment of a fabrication method may be used to fabricate a portion of a memory cell similar to the memory cell 600 of FIG. 6A. Various techniques, for example, ALD, have already been described above with reference to FIG. 6A.

In an alternative embodiment, the multi-metal electrode 909 is fabricated by depositing or otherwise forming two or more metals substantially concurrently. This embodiment of a fabrication method may be used to fabricate a portion of a memory cell similar to the memory cell 630 of FIG. 6B.

Regardless of which fabrication method is chosen, the multi-metal electrode 909 may comprise any of the materials described, above, with reference to the multi-layer stack electrode 611 of FIG. 6A or the mixed layer electrode 631 of FIG. 6B. After formation of the multi-metal electrode 909, an annealing operation may be used to at least partially oxidize one or more of the metals in the multi-metal electrode 909. In one embodiment, the oxygen atoms to oxidize the one or more of the metals in the multi-metal electrode 909 are supplied by the memory material 907. In another embodiment, the oxygen atoms to oxidize the one or more of the metals in the multi-metal electrode 909 are supplied by gaseous oxygen introduced as part of the fabrication process. In still another embodiment, the oxygen atoms to oxidize the one or more of the metals in the multi-metal electrode 909 are supplied by a combination of the memory material 907 and the gaseous oxygen. An optional CMP operation may be used after fabricating the multi-metal electrode 909 to form a substantially co-planar upper surface of the multi-metal electrode 909 and the opened dielectric 903B.

Figure 9F:
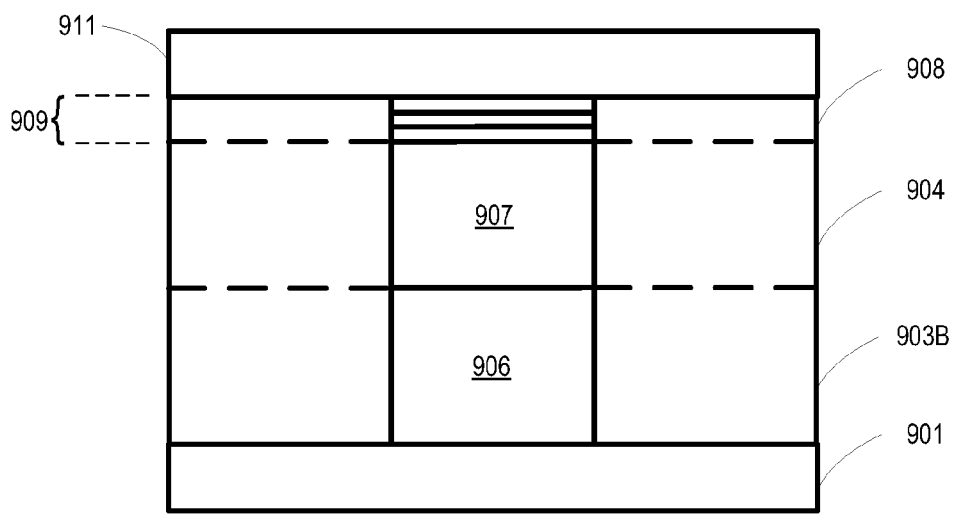

In FIG. 9F, a top electrode 911 is deposited, sputtered, or otherwise formed above the upper surface of the multi-metal electrode 909 and the opened dielectric 903B. Although shown as completely covering the upper surface of the multi-metal electrode 909 and the opened dielectric 903B, the top electrode 911 in some embodiments does not do so, being applied only to a degree sufficient to enable electrical communication with the multi-metal electrode 909. The top electrode may be comprised of any of the materials discussed, above, with reference to the top electrode 601 of FIGS. 6A and 6B.

Although the fabrication process in FIGS. 9A through 9F is shown to include only two metal components in the multi-metal electrode 909, one of ordinary skill in the art, upon reading this disclosure, will appreciate that any number of metals or components can be employed. Further, each of the metals may vary in thickness relative to the one or more additional metals. In the case of the metal components being formed substantially concurrently, the ratio of one of the metal components to the other metal components may be similar or may vary considerably, one to another, and may be held relatively constant in some embodiments.

The various illustrations of apparatus (e.g., the memory device 101 and various ones of the memory cell 600, 630, 700) are intended to provide a general understanding of the structure of various embodiments and are not intended to provide a complete description of all the elements and features of the apparatus that might make use of the structures, feature, and materials described herein.

The apparatus of the various embodiments may include or be included in, for example, electronic circuitry used in high-speed computers, communication and signal processing circuitry, single or multi-processor modules, single or multiple embedded processors, multi-core processors, data switches, and application-specific modules including multilayer, multi-chip modules, or the like. Such apparatus may further be included as sub-components within a variety of electronic systems, such as televisions, cellular telephones, personal computers (e.g., laptop computers, desktop computers, hand-held computers, tablet computers, etc.), workstations, radios, video players, audio players, vehicles, medical devices (e.g., heart monitors, blood pressure monitors, etc.), set top boxes, and various other electronic systems.

The various embodiments described herein include a memory device and methods of forming the same. The memory device can include an electrode coupled to a memory element. The electrode can include different materials forming different portions of the electrode. These materials can create different dielectric materials contacting the memory elements at different locations. Various states of the materials in the memory device can be used to represent stored information. Other embodiments are described above with reference to the various figures.

The above description and the drawings illustrate some embodiments of the invention to enable those skilled in the art to practice the embodiments of the invention. Other embodiments may incorporate structural, logical, electrical, process, or other changes. Examples merely typify possible variations. Portions and features of some embodiments may be included in, or substituted for, those of others. Many other embodiments will be apparent to those of ordinary skill in the art upon reading and understanding the description provided herein.

The Abstract of the Disclosure is provided to comply with 37 C.F.R. §1.72(b), requiring an abstract that allows the reader to quickly ascertain the nature of the technical disclosure. It is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A memory device comprising:
at least one memory element to store information; and a first electrode coupled to the at least one memory element, the first electrode having a plurality of metals, the plurality of metals being dispersed substantially randomly over a surface of the at least one memory element coupled to the plurality of metals, a first metal of the plurality of metals having a Gibbs free energy of oxidation lower than a Gibbs free energy of oxidation of a second metal of the plurality of metals.

2. The memory device of claim 1, wherein each of the plurality of metals is layered and substantially parallel to a surface of the at least one memory element coupled to the plurality of metals.

3. The memory device of claim 1, wherein the at least one memory element is configured to store multiple bits of information.

4. The memory device of claim 1, further including a second electrode coupled to the at least one memory element such that the at least one memory element is disposed between the second electrode and the first electrode.

5. The memory device of claim 1, wherein the at least one memory element includes at least one of $Pr_xCa_yMn_zO$, $La_xCa_yMnO_z$, $La_xSr_yCo_xY$, $TiO_x$, $HfO_x$, or $ZrO_x$.

6. The memory device of claim 1, wherein the at least one memory element includes a mixed valence oxide.

7. A memory device comprising:
a plurality of metals, a first metal of the plurality of metals having a Gibbs free energy of oxidation lower than a Gibbs free energy of oxidation of a second metal of the plurality of metals; and
a memory element coupled to the plurality of metals, the memory element to provide oxygen atoms to the plurality of metals when a bias voltage is applied across the memory element and the plurality of metals, the memory element being at least partially comprised of a mixed valence oxide.

8. The memory device of claim 7, wherein the Gibbs free energy of oxidation of the first metal of the plurality of metals is more negative than a Gibbs free energy of oxidation of the memory element.

9. The memory device of claim 7, further comprising a first electrode and a second electrode, the plurality of metals and the memory element being disposed between the first electrode and the second electrode.

10. The memory device of claim 7, wherein the memory element is configured to store bits of information.

11. The memory device of claim 8, wherein the memory element includes oxygen.

12. A memory device comprising:
a first electrode to be coupled to a first voltage supply terminal;
at least one memory element coupled to the first electrode and comprising a mixed valence oxide; and
a second electrode to be coupled to a second voltage supply terminal, the second electrode including a plurality of metals coupled to the at least one memory element, the plurality of metals having at least one metal oxide to store information in the at least one memory element in response to an electrical bias generated by a voltage supply, when the voltage supply is coupled to the first and the second electrodes.

13. The memory device of claim 12, wherein a first metal of the plurality of metals has a Gibbs free energy of oxidation lower than a Gibbs free energy of oxidation of a second metal of the plurality of metals.

14. The memory device of claim 12, wherein the at least one memory element includes a material having oxygen.

15. A method of forming a memory device, the method comprising:
forming a memory material;
forming a first metal over the memory material, the first metal having a Gibbs free energy of oxidation more negative than a Gibbs free energy of the memory material;
forming a second metal over the memory material, the second metal having a Gibbs free energy of oxidation more negative than the Gibbs free energy of oxidation of the first metal; and
annealing the memory device to at least partially oxidize the first metal and the second metal.

16. The method of claim 15, further comprising supplying oxygen atoms to oxidize the first metal and the second metal by the memory material.

17. The method of claim 15, further comprising supplying gaseous oxygen to the memory device during the annealing to supply oxygen atoms to oxidize the first metal and the second metal.

18. The method of claim 15, further comprising forming the first metal and the second metal in alternate layers.

19. The method of claim 15, further comprising forming the first metal and the second metal concurrently.

20. A method of forming a memory device, the method comprising:
forming a mixed valence oxide;
forming a first metal over the mixed valence oxide;
forming a second metal over the mixed valence oxide; and
at least partially oxidizing the first metal and the second metal with oxygen atoms from the mixed valence oxide.

21. The method of claim 20, wherein forming the first metal and the second metal over the mixed valence oxide further comprise:
forming the first metal having a Gibbs free energy of oxidation more negative than a Gibbs free energy of oxidation of the mixed valence oxide; and
forming the second metal having a Gibbs free energy of oxidation more negative than the Gibbs free energy of oxidation of the first metal.

22. The method of claim 20, further comprising forming the first metal and the second metal consecutively.

23. The method of claim 20, further comprising forming the first metal and the second metal concurrently.

24. The method of claim 20, wherein the first metal and the second metal include different metal materials.

25. A memory device comprising:
a plurality of metals, a first metal of the plurality of metals having a Gibbs free energy of oxidation lower than the Gibbs free energy of oxidation of a second metal of the plurality of metals; and
a memory element coupled to the plurality of metals, the plurality of metals being dispersed substantially randomly over a surface of the memory element coupled to the plurality of metals, the memory element to provide oxygen atoms to the plurality of metals when a bias voltage is applied across the memory element and the plurality of metals, the memory element being at least partially comprised of a mixed valence oxide.

26. A memory device comprising:
a first electrode to be coupled to a first voltage supply terminal;
at least one memory element coupled to the first electrode and comprising a mixed valence oxide; and
a second electrode to be coupled to a second voltage supply terminal, the second electrode including a plurality of metals coupled to the at least one memory element, the plurality of metals being dispersed substantially randomly over a surface of the at least one memory element coupled to the plurality of metals, the plurality of metals having at least one metal oxide to store information in the at least one memory element in response to an electrical bias generated by a voltage supply, when the voltage supply is coupled to the first and the second electrodes.

\* \* \* \* \*

UNITED STATES PATENT AND TRADEMARK OFFICE
CERTIFICATE OF CORRECTION

| | | |
|---|---|---|
| PATENT NO. | : 8,592,795 B2 | Page 1 of 1 |
| APPLICATION NO. | : 13/175320 | |
| DATED | : November 26, 2013 | |
| INVENTOR(S) | : Gurtej S. Sandhu et al. | |

It is certified that error appears in the above-identified patent and that said Letters Patent is hereby corrected as shown below:

In the Claims

In column 17, line 47, In Claim 11, delete "claim 8," and insert -- claim 7, --, therefor.

Signed and Sealed this
Twenty-fifth Day of March, 2014

Michelle K. Lee
*Deputy Director of the United States Patent and Trademark Office*